(12) United States Patent
Marakhtanov et al.

(10) Patent No.: US 9,401,264 B2
(45) Date of Patent: Jul. 26, 2016

(54) CONTROL OF IMPEDANCE OF RF DELIVERY PATH

(71) Applicant: Lam Research Corporation, Fremont, CA (US)

(72) Inventors: Alexei Marakhtanov, Albany, CA (US); Rajinder Dhindsa, San Jose, CA (US); Ken Lucchesi, Newark, CA (US); Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 14/043,574

(22) Filed: Oct. 1, 2013

(65) Prior Publication Data

US 2015/0091441 A1     Apr. 2, 2015

(51) Int. Cl.
*H01J 7/24* (2006.01)
*H01J 37/32* (2006.01)

(52) U.S. Cl.
CPC ..... *H01J 37/32183* (2013.01); *H01J 37/32174* (2013.01)

(58) Field of Classification Search
None
See application file for complete search history.

(56) References Cited

U.S. PATENT DOCUMENTS

| | | | | |
|---|---|---|---|---|
| 6,242,360 B1 * | 6/2001 | Fischer | ............. | H01J 37/32082 156/345.44 |
| 6,313,584 B1 * | 11/2001 | Johnson | ............. | H01J 37/32082 315/111.21 |
| 6,335,288 B1 * | 1/2002 | Kwan | ............. | C23C 16/045 257/E21.276 |
| 6,506,685 B2 * | 1/2003 | Li | ............. | H01J 37/32165 118/723 E |
| 6,583,572 B2 * | 6/2003 | Veltrop | ............. | H01J 37/32174 118/723 I |
| 6,727,655 B2 * | 4/2004 | McChesney | ............. | H01J 37/32082 156/345.24 |
| 6,887,339 B1 * | 5/2005 | Goodman | ............. | H01J 37/32082 118/723 E |
| 7,435,926 B2 * | 10/2008 | Jafarian-Tehrani | | H01J 37/32082 118/723 I |
| 7,811,941 B1 * | 10/2010 | Becker | ............. | H01J 37/321 216/67 |
| 8,062,717 B2 | 11/2011 | Blonigan et al. | | |

(Continued)

OTHER PUBLICATIONS

Lessons in Electric Circuits vol. II Chapter 14 web publication http://www.ibiblio.org/kuphaldt/electricCircuits/AC/AC_14.html (Jan. 2000-2012).*

(Continued)

*Primary Examiner* — Douglas W Owens
*Assistant Examiner* — Srinivas Sathiraju
(74) *Attorney, Agent, or Firm* — Martine Penilla Group, LLP

(57) ABSTRACT

A plasma system includes an RF generator and a matchbox including an impedance matching circuit, which is coupled to the RF generator via an RF cable. The plasma system includes a chuck and a plasma reactor coupled to the matchbox via an RF line. The RF line forms a portion of an RF supply path, which extends between the RF generator through the matchbox, and to the chuck. The plasma system further includes a phase adjusting circuit coupled to the RF supply path between the impedance matching circuit and the chuck. The phase adjusting circuit has an end coupled to the RF supply path and another end that is grounded. The plasma system includes a controller coupled to the phase adjusting circuit. The controller is used for changing a parameter of the phase adjusting circuit to control an impedance of the RF supply path based on a tune recipe.

28 Claims, 15 Drawing Sheets

(56) References Cited

U.S. PATENT DOCUMENTS

| | | | |
|---|---|---|---|
| 8,262,847 B2* | 9/2012 | Dhindsa | H01J 37/32165 118/723 E |
| 2005/0022736 A1 | 2/2005 | Steger | |
| 2006/0088655 A1* | 4/2006 | Collins | C23C 14/48 427/8 |
| 2006/0112878 A1 | 6/2006 | Ni et al. | |
| 2006/0226786 A1* | 10/2006 | Lin | H01J 37/3299 315/111.21 |
| 2008/0160776 A1* | 7/2008 | Dhindsa | H01J 37/32165 438/710 |
| 2009/0200269 A1 | 8/2009 | Kadkhodayan et al. | |
| 2010/0007362 A1* | 1/2010 | Booth | H01J 37/32935 324/686 |
| 2011/0100552 A1* | 5/2011 | Dhindsa | H01J 37/32174 156/345.1 |
| 2011/0128017 A1* | 6/2011 | Booth | H01J 37/32935 324/658 |
| 2012/0318456 A1* | 12/2012 | Brouk | H01J 37/32009 156/345.28 |
| 2012/0319584 A1* | 12/2012 | Brouk | H01J 37/32009 315/111.21 |
| 2013/0023064 A1* | 1/2013 | Marakhtanov | H01J 37/32091 438/5 |
| 2013/0059448 A1* | 3/2013 | Marakhtanov | H01J 37/32091 438/711 |
| 2013/0126475 A1* | 5/2013 | Dhindsa | H01J 37/32165 216/61 |
| 2013/0127124 A1* | 5/2013 | Nam | H01J 37/32577 279/128 |
| 2013/0133834 A1* | 5/2013 | Dhindsa | H01L 21/67069 156/345.51 |
| 2013/0327481 A1* | 12/2013 | Marakhtanov | H01J 37/32091 156/345.28 |
| 2014/0062303 A1* | 3/2014 | Hoffman | H05H 1/46 315/111.21 |

OTHER PUBLICATIONS

U.S. Appl. No. 13/594,768, filed Aug. 24, 2012, Chen et al.

H. Schmidt et al, "Improving plasma uniformity using lens-shaped electrodes in a large area very high frequency reactor", Journal of Applied Physics, vol. 95, No. 9, May 1, 2004, (7 pages).

Koshiishi et al., "Investigation of Etch Rate Uniformity of 60 MHz Plasma Etching Equipment", 2001 The Japan Society of Applied Physics, vol. 40, Pt. 1, No. 11, pp. 6613-6618.

R. Fehr. "Harmonics Made Simple", BC&M Jan. 2004, (7 pages).

* cited by examiner

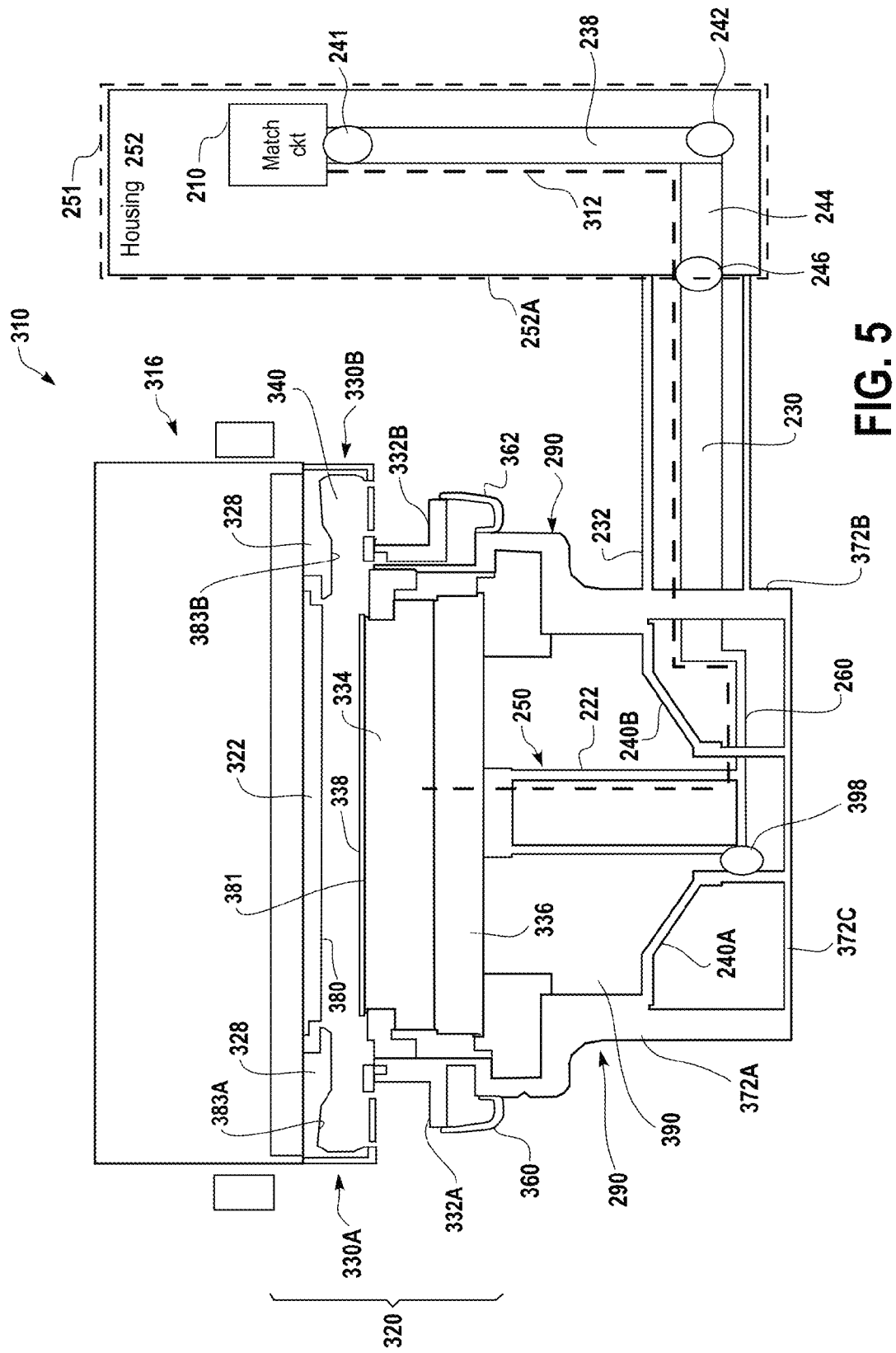

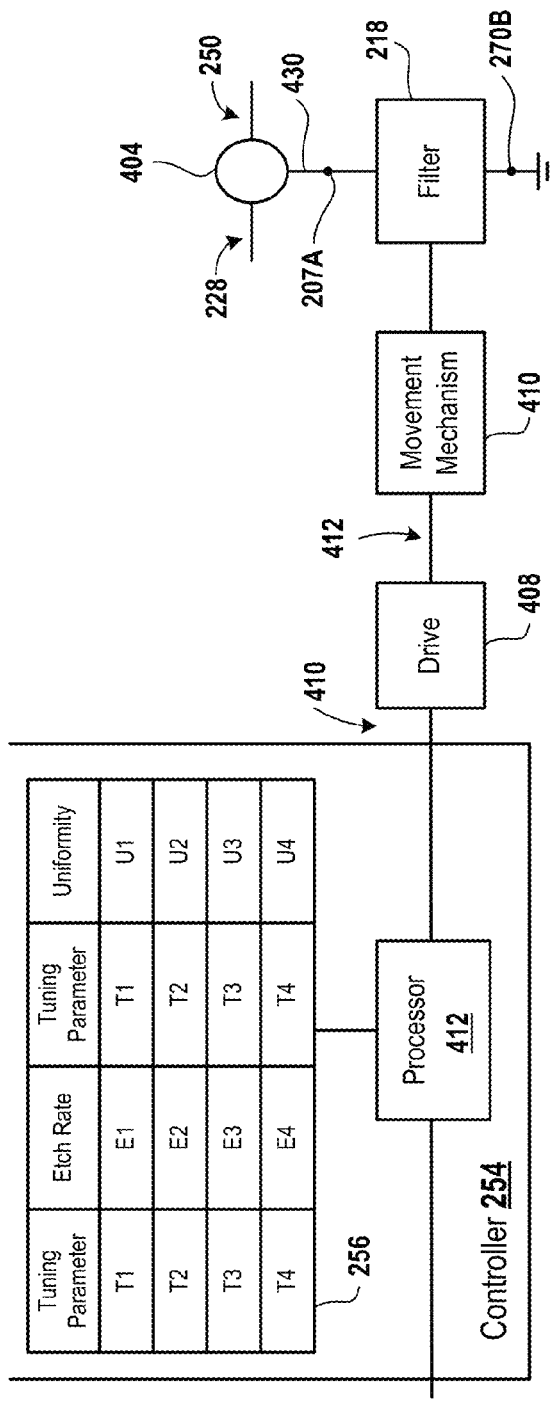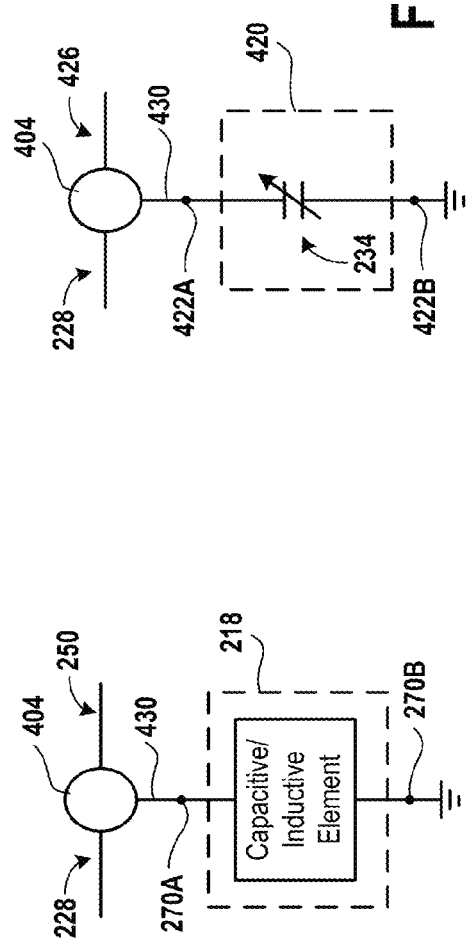
FIG. 6A
FIG. 6B
FIG. 6C

CONTROL OF IMPEDANCE OF RF DELIVERY PATH

CROSS-REFERENCE TO RELATED APPLICATIONS

The present patent application is related to a patent application having Application Ser. No. 14/043,525, filed on Oct. 1, 2013, and titled "CONTROL OF IMPEDANCE OF RF RETURN PATH", which is incorporated by reference herein in its entirety.

FIELD

The present embodiments relate to controlling an impedance of a radio frequency (RF) delivery path.

BACKGROUND

Plasma-based systems include a supply source that is used to generate a signal. The plasma-based systems further include a chamber, which receives the signal to generate plasma. The plasma is used for a variety of operations including cleaning a wafer, depositing oxides and thin films on the wafer, and etching away a portion of the wafer or a portion of the oxides and the thin films.

Some properties of plasma, such as standing waves in plasma, etc., are difficult to control in order to be able to control uniformity of plasma etching or depositing. The difficulty in controlling plasma properties results in a non-uniformity in etching of material of the wafer or in deposition of material on the wafer. For example, the wafer is etched more at a first distance from its center than at a second distance away from the center. The second distance is further away from the center than the first distance. As another example, the wafer is etched less at the first distance than at the second distance. As yet another example, a higher amount of material is deposited on the wafer at the first distance compared to that deposited at the second distance. As another example, a higher amount of material is deposited on the wafer at the second distance compared to that deposited at the first distance. The non-uniformity in etching results in an M-shaped etch or a W-shaped etch of a wafer. The non-uniformity in etching or depositing results in a reduced wafer yield.

It is in this context that embodiments described in the present disclosure arise.

SUMMARY

Embodiments of the disclosure provide apparatus, methods and computer programs for controlling an impedance of a radio frequency (RF) delivery path. It should be appreciated that the present embodiments can be implemented in numerous ways, e.g., a process, an apparatus, a system, a piece of hardware, or a method on a computer-readable medium. Several embodiments are described below.

In some embodiments, uniformity is achieved by controlling an impedance of an RF delivery path, e.g., an RF supply path, etc., in a plasma tool. The RF delivery path is formed between an RF generator and a gap of a plasma chamber. The impedance is controlled by controlling a capacitance and/or an inductance between an impedance matching circuit of the plasma tool and a plasma reactor of the plasma tool. When the impedance is controlled, the uniformity is achieved.

In various embodiments, a plasma system for controlling an impedance of an RF supply path includes an RF generator and a matchbox including an impedance matching circuit, which is coupled to the RF generator via an RF cable. The plasma system includes a chuck and a plasma reactor coupled to the matchbox via an RF line. The RF line forms a portion of an RF supply path, which extends from the RF generator through the matchbox, and to the chuck. The plasma system further includes a phase adjusting circuit coupled to the RF supply path between the impedance matching circuit and the chuck. The phase adjusting circuit has an end coupled to the RF supply path and another end that is grounded. The plasma system includes a controller coupled to the phase adjusting circuit. The controller is used for changing a parameter of the phase adjusting circuit to control an impedance of the RF supply path based on a tune recipe.

In some embodiments, a system for controlling an impedance of an RF supply path includes a filter, which is located between an impedance matching circuit and a plasma chamber. The filter is coupled to ground and is used to control an impedance of an RF delivery path. The RF delivery path is used to transfer an RF signal that is output from the impedance matching circuit towards the plasma chamber.

In several embodiments, a method for controlling an impedance of an RF supply path includes receiving an RF signal from an impedance matching circuit, which is coupled to an RF generator of a plasma tool. The method further includes modifying an impedance of the RF signal to achieve a measurable factor and sending the modified RF signal via a portion of an RF supply path to a plasma reactor. The plasma reactor is coupled to the impedance matching circuit.

Some advantages of some of the above-described embodiments include a control of uniformity in etch rates or deposition rates applied to a substrate. For example, an impedance of an RF delivery path is controlled by a filter to achieve the uniformity. A capacitance, an inductance, or a combination thereof, of the filter is changed to control the impedance of the RF delivery path. The control in uniformity reduces non-uniformity in the etch rates or in the deposition rates.

Additional advantages of some of the above-described embodiments include controlling an impedance of an RF delivery path of a plasma system to achieve a pre-determined uniformity in etch rates or in deposition rates. The pre-determined uniformity is stored within a tune recipe. Moreover, a one-to-one correspondence between the pre-determined uniformity and an inductance, a capacitance, or a combination thereof of a filter is stored in the tune recipe. A processor is programmed to achieve the pre-determined uniformity listed within the tune recipe. The processor retrieves an inductance, a capacitance, or a combination thereof that corresponds to a measurable factor, e.g., an etch rate, or a deposition rate, or a uniformity in etch rates, or a uniformity in deposition rates, or a combination thereof, etc., from the tune recipe and controls a capacitance and/or an inductance of the filter to achieve the etch rate, or the deposition rate, or the uniformity in etch rates, or the uniformity in deposition rates. The change in the inductance, the capacitance, or a combination thereof, of the filter allows the processor to achieve uniformity in etch rates of etching a substrate or in deposition rates of depositing materials on the substrate. The change in the inductance, the capacitance, or a combination thereof, of the filter creates a low impedance path to ground for a harmonic of an RF supply signal that is used to generate another RF signal to be supplied to a plasma chamber. By controlling the RF harmonic, standing waves in plasma formed within the plasma chamber is controlled to achieve uniformity in etch rates or deposition rates.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 5 is a diagram of a system for illustrating different points to which a filter is connected along an RF supply path, in accordance with one embodiment described in the present disclosure.

FIG. 6A is a diagram of a system for modifying an impedance of an RF supply signal that is provided by an impedance matching circuit, in accordance with one embodiment described in the present disclosure.

FIG. 6B is a diagram of a filter as a capacitive element and/or an inductive element, in accordance with one embodiment described in the present disclosure.

FIG. 6C is a diagram of a capacitive filter, in accordance with one embodiment described in the present disclosure.

DETAILED DESCRIPTION

The following embodiments describe systems and methods for controlling an impedance of a radio frequency (RF) delivery path. It will be apparent that the present embodiments may be practiced without some or all of these specific details. In other instances, well known process operations have not been described in detail in order not to unnecessarily obscure the present embodiments.

Figure 1:
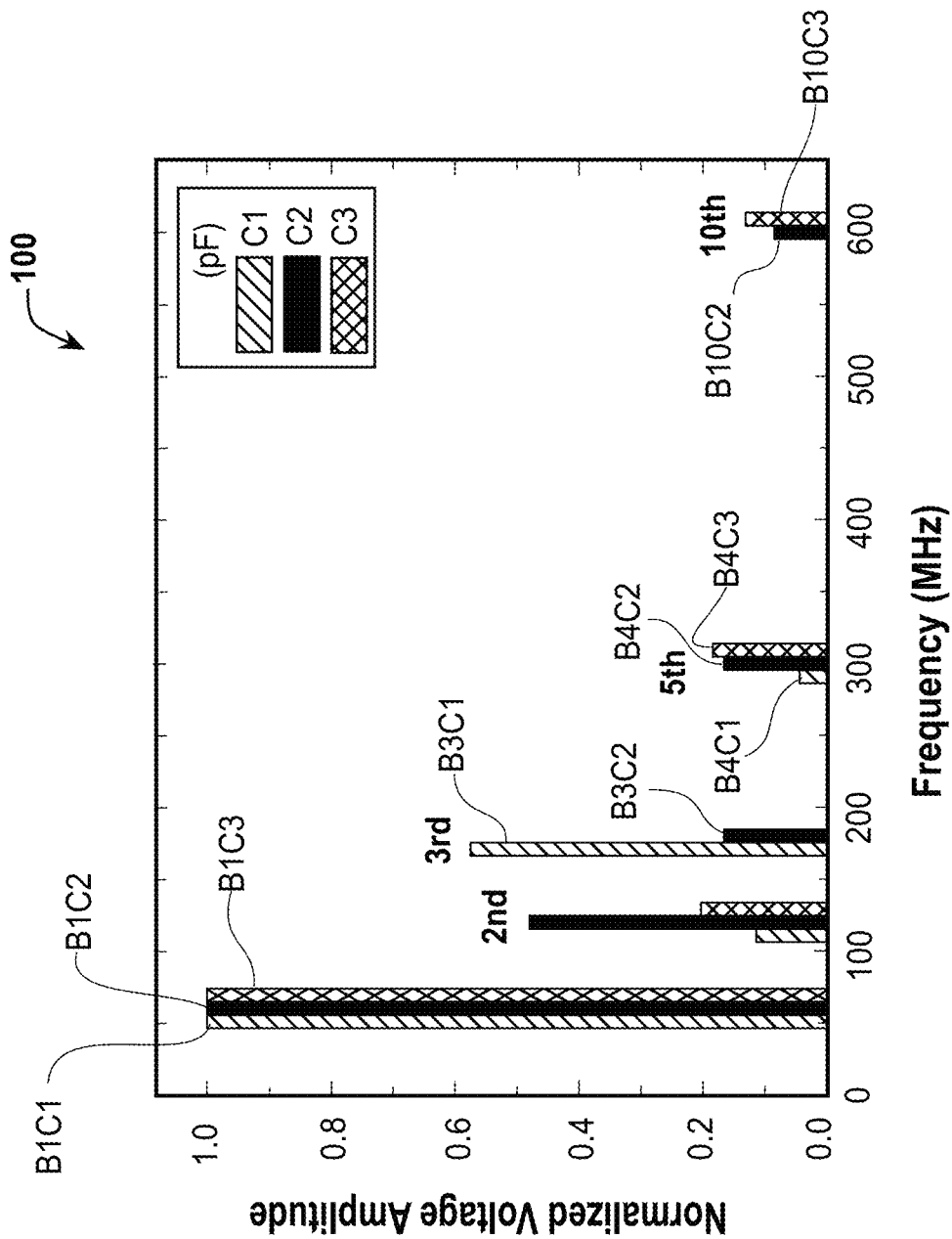
FIG. 1 is a graph that is used to illustrate a non-uniformity in a normalized voltage at a high order harmonic of a 60 MHz signal, in accordance with one embodiment described in the present disclosure.

FIG. 1 is an embodiment of a graph 100 that is used to illustrate a non-uniformity in a normalized voltage at a high order harmonic of a 60 MHz signal. The high order harmonic creates a standing wave voltage in plasma and the standing wave voltage results in a non-uniformity in etching a substrate or depositing materials on the substrate.

In various embodiments, the high order harmonic is a harmonic of a third order or higher. In some embodiments, the high order harmonic is a harmonic of a second order or higher.

The graph 100 plots a normalized voltage amplitude, of an RF signal, measured at an input of an upper electrode of a plasma chamber versus frequency of the RF signal. In several embodiments, a voltage is measured at the input of the upper electrode and is normalized to generate the normalized voltage.

As shown in the graph 100, at a third order harmonic of the RF signal, there is non-uniformity in voltage that is measured at the input of the upper electrode for three different capacitance values of a filter that is coupled to the input of the upper electrode are used. For example, a bar B3C1 corresponds to a capacitance value C1 of the filter and a bar B3C2 corresponds to a capacitance value C2 of the filter.

In some embodiments, an output of the upper electrode is at a bottom surface of the upper electrode. The top surface is located opposite to a bottom surface of the upper electrode and is at the input of the upper electrode. The bottom surface of the upper electrode faces a gap within the plasma chamber. The gap is formed between the upper electrode and a chuck, e.g., an electrostatic chuck (ESC), etc. The chuck is located within the plasma chamber and includes a lower electrode that faces the upper electrode. The chuck is disposed on a facility plate that is located below the lower electrode.

Moreover, as shown in the graph 100, at a fifth order harmonic and at a tenth order harmonic of the RF signal, there is non-uniformity in voltage measured at the upper electrode. For example, a bar B5C1 corresponds to the capacitance value Cl, a bar B5C2 corresponds to the capacitance value C2, and a bar B5C3 corresponds to a capacitance value C3 of the filter. As another example, at the tenth order harmonic, a bar B10C2 corresponds to the capacitance value C2 and a bar B10C3 corresponds to the capacitance value C3.

Also, shown in the graph 100 is a bar B1C1 that corresponds to the capacitance value C1, a bar B1C2 that corresponds to the capacitance value C2, and a bar B1C3 that corresponds to the capacitance value C3.

Moreover, a table 1 provided below illustrates a decrease in a standing wavelength λ in plasma with an increase in frequency of the RF signal.

TABLE 1

| Frequency (MHz) | Standing Wavelength (centimeters) | Standing Quarter Wavelength (centimeters) (pattern radius on a substrate) |
|---|---|---|
| 60 | 113 | 28 |
| 120 | 43 | 11 |
| 180 | 24 | 6 |
| 240 | 16 | 4 |
| 300 | 12 | 3 |
| 360 | 9 | 2.3 |
| 420 | 7 | 1.8 |
| 480 | 6 | 1.5 |
| 600 | 3.5 | 0.87 |

It should be noted that in various embodiments, the table 1 is generated for a gap, within the plasma chamber, between the upper and lower electrodes and a voltage of the RF signal.

In some embodiments, the standing wavelength in plasma is determined as a function of an applied RF voltage, a frequency of the RF signal and the gap. The function is illustrated using an equation:

$$\lambda/\lambda_0 \approx 40 V_0^{1/10} l^{-1/2} f^{-2/5} \quad (1)$$

where $V_0$ is the applied RF voltage, l is a length of the gap, $\lambda_0$ is a standing wavelength measured in vacuum, and f is a frequency of the RF signal. The length l of the gap is a distance between the lower electrode and the upper electrode. The applied RF voltage is applied to an electrode of the plasma chamber.

The decrease in the standing wavelength λ with the increase in a harmonic frequency of the RF signal results in non-uniformity in etch rates or deposition rates. The non-uniformity in etch rates include non-uniformities in rates of etching a substrate, e.g., a wafer, or a wafer on which integrated circuits are fabricated, etc., in the plasma chamber. Moreover, the non-uniformities in deposition rates include non-uniformities in rates of depositing materials on the substrate. The non-uniformity in the etch rates is illustrated below in FIG. 3.

Figure 2:
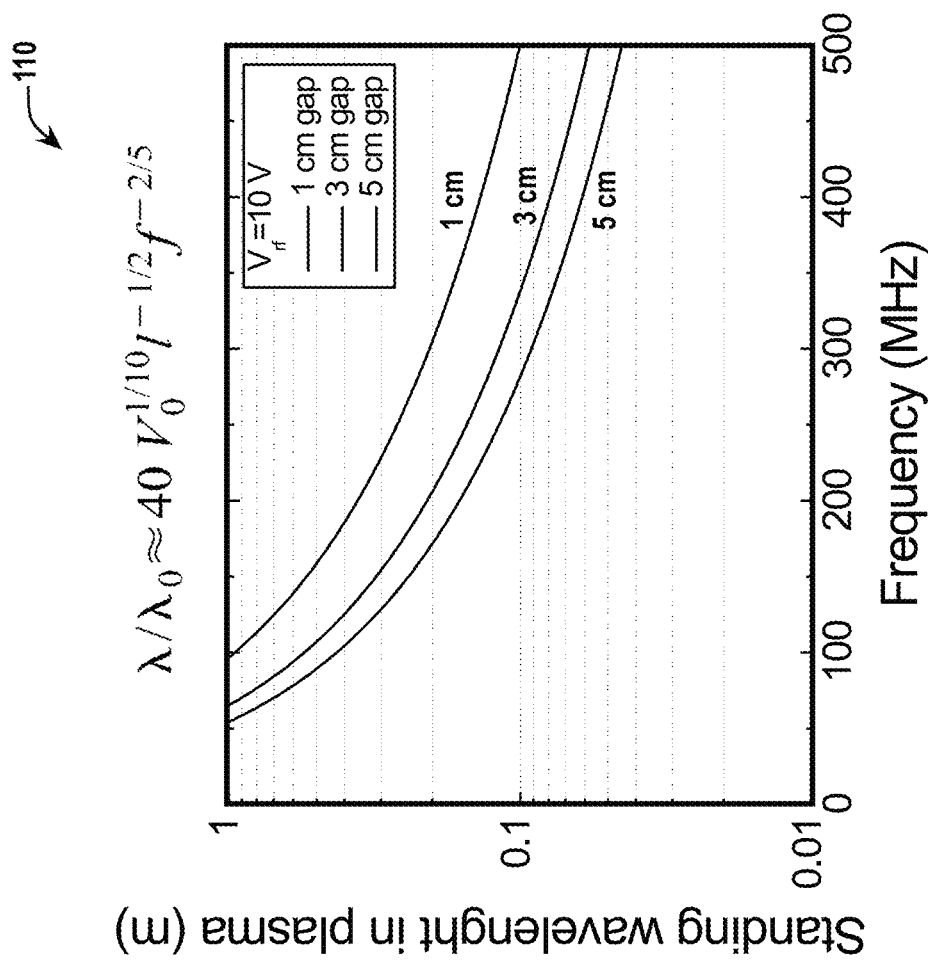
FIG. 2 is a graph to illustrate a change in a standing wavelength λ in plasma with a change in a frequency of a radio frequency (RF) signal and with a change in a gap, in accordance with one embodiment described in the present disclosure.

FIG. 2 is an embodiment of a graph 110 to illustrate a change in the standing wavelength λ in plasma with a change in a frequency of the RF signal and/or with a change in the gap between the upper and lower electrodes. The graph 110 plots the standing wavelength λ versus the frequency of the RF signal. The frequency of the RF signal is plotted in megahertz (MHz) and the standing wavelength is plotted in meters (m) in the graph 110. As shown in the graph 110, for each gap of 1 cm, 3 cm, and 5 cm, there is a decrease in the standing wavelength λ with an increase in a frequency of the RF signal.

Figure 3:
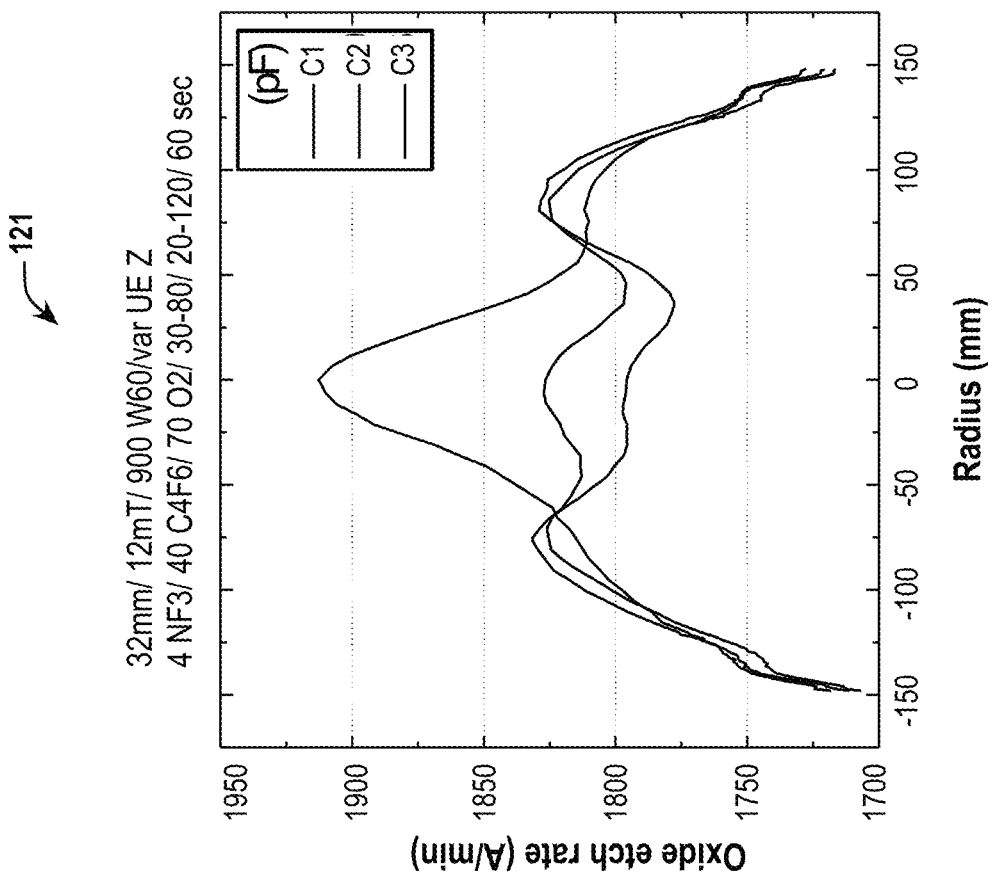
FIG. 3 is a graph for illustrating a change in non-uniformity in etch rates with an increase in a capacitance value of a filter that is connected to an input of an upper electrode and with an increase in a harmonic of an RF signal, in accordance with one embodiment described in the present disclosure.

FIG. 3 is an embodiment of a graph 121 for illustrating a non-uniformity in etch rates with a change in a distance along a radius of the substrate. The graph 121 plots an etch rate, measured in Angstroms per minute (A/min) versus a radius of the substrate for the three different capacitance values C1 thru C3. The radius of the substrate is measured in millimeters (mm).

It is noted that a curve that corresponds to the capacitance value C1 in the graph 121 is created as a result of a third harmonic of the RF signal. The curves that correspond to the capacitance values C2 and C3 in the graph 121 are created as a result of a second harmonic of the RF signal. The curves that correspond to the capacitance values C2 and C3 in the graph 121 have a higher amount of uniformity compared to the curve that corresponds to the capacitance value C1 in the graph 121.

It should be noted that the graph 121 is generated for a process condition, which includes a value of the gap, or a pressure within the plasma chamber, or a combination of one or more process gases supplied to the plasma chamber, or a time for which the process gases are supplied, or an identity of an RF generator that is on, or a combination thereof, etc. The RF generator is on when the RF generated is powered on and is supplying power.

Examples of the RF generator include an x MHz RF generator, a y MHz RF generator, and a z MHz RF generator. Examples of x, y, and z include 2, 27, and 60. It should be noted that a frequency of operation of an RF generator is not limiting and encompasses other frequencies that are within a pre-determined operating range of the frequency. For example, although a generator is referred to herein as a 2 MHz RF generator, the generator operates between 1 and 3 MHz. As another example, although a generator is referred to herein as a 27 MHz RF generator, the generator operates between 25 and 29 MHz. As yet another example, although a generator is referred to herein as a 60 MHz RF generator, the generator operates between 57 and 63 MHz.

Figure 4A:
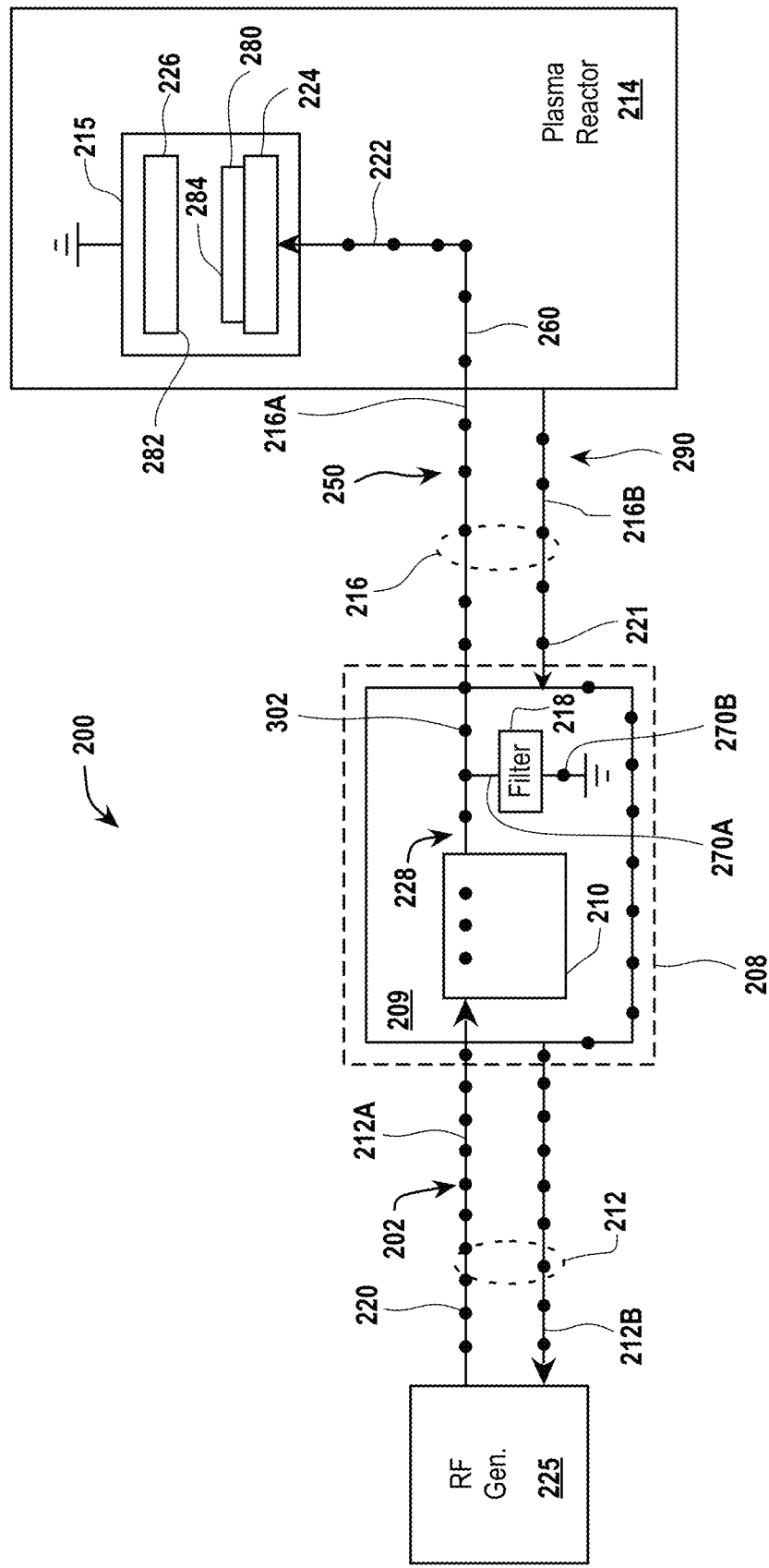
FIG. 4A is a diagram of a plasma tool for controlling an impedance of an RF supply path of the system, in accordance with one embodiment described in the present disclosure.

FIG. 4A is a diagram of an embodiment of a plasma tool 200 for controlling an impedance of an RF supply path 220 of the plasma tool 200. The plasma tool 200 includes an RF generator 225, an RF cable system 212, a matchbox 208, an RF transmission line 216, and a plasma reactor 214. The RF cable system 212 couples the RF generator 225 to the matchbox 208 and the RF transmission line 216 couples the matchbox 208 to the plasma reactor 214.

Examples of the RF generator 225 include the x, y, or z MHz RF generator. In some embodiments, any number of RF generators, e.g., the x MHz RF generator, the y MHz RF generator, and/or the z MHz RF generator, etc., are coupled to the matchbox 208. The RF cable system 212 includes an RF cable 212A and an RF cable sheath 212B. The RF cable sheath 212B surrounds the RF cable 212A to protect the RF cable 212A. In some embodiments, an RF cable and an RF cable sheath, as referred to herein, is made of a conductor, e.g., a metal, etc. Examples of a metal include copper, or aluminum, or a combination thereof, etc. In various embodiments, the RF cable sheath 212B encloses the RF cable 212A. The RF cable system 212 is coupled to the RF generator 225 and the matchbox 208.

Similarly, the RF transmission line 216 includes an RF rod 216A and an RF tunnel 216B. The RF tunnel 216B surrounds the RF rod 216A. In various embodiments, the RF tunnel 216B is made of a metal, surrounds and encloses the RF rod 216A, and is separated from the RF rod 216A by an insulator material. Examples of the metal include copper, or aluminum, or a combination thereof, etc. The RF transmission line 216 is coupled to the matchbox 208 and to the plasma reactor 214. In some embodiments, the RF tunnel 216B is grounded, e.g., coupled to a ground potential, coupled to a reference potential, etc.

In some embodiments, an RF rod is referred to herein as an RF line.

In several embodiments, an RF rod is made of a metal, e.g., copper, or aluminum, or a combination thereof, etc.

In various embodiments, an insulator surrounds the RF rod 216A and the RF tunnel 216B encloses the insulator. The insulator is located between the RF rod 216A and the RF tunnel 216B.

It should be noted that in some embodiments, each of the RF cable 212A, the RF cable sheath 212B, the RF rod 216A, and the RF tunnel 216B has a cross-section of any shape, e.g., circular, polygonal, square, etc.

The matchbox 208 includes a housing 209. In some embodiments, the housing 209 encloses and surrounds an impedance matching circuit 210 to protect the impedance matching circuit 210. Moreover, the housing 209 encloses and surrounds a filter 218 located within the matchbox 208 to protect the filter 218.

In some embodiments, the filter 218 is accessed from within the housing 209 after opening connection mechanisms, e.g., screws, bolts, etc., that are used to form walls of the housing 209. In several embodiments, the filter 218 is located within a housing (not shown) that is located within the housing 209 of the matchbox 208. The housing (not shown) of the filter 218 surrounds the filter 218 and protects the filter 218 and allow easy removal and installation of the filter 218 within the housing 209.

The filter 218 is coupled at a point 258 on an RF connection 302 that is coupled to the RF rod 216A and that is located between the impedance matching circuit 210 and the plasma reactor 214. An example of the RF connection 302 includes one or more RF straps, or one or more RF rods, or a combination of one or more RF rods and one or more RF straps. In some embodiments, an RF strap is made of a conductive metal, e.g., copper, or a mixture of copper and another metal, or aluminum, or a combination thereof, etc. The RF connection 302 is coupled to the impedance matching circuit 210. The filter 218 is grounded, e.g., coupled to a reference potential, or coupled to a ground potential, or coupled to zero potential, etc., at an end 270B opposite to an end 270A of the filter 218 connected to the point 258. In some embodiments, a reference potential is a non-zero potential. In various embodiments, the point 258 is a point on the RF connection 302.

In various embodiments, the end 270B of the filter 218 that is grounded is connected to the housing 209 of the matchbox 208. The housing 209 is grounded.

It should be noted that in some embodiments, grounded, as used herein, refers to being coupled to a reference potential, or being coupled to a ground potential, or being coupled to zero potential, etc.

The impedance matching circuit 210 includes a combination of circuit elements, e.g., resistors, or capacitors, or inductors, or a combination thereof, etc., to match an impedance of a source with that of a load. The source supplies an RF signal to the impedance matching circuit 210 and the load consumes an RF signal that is supplied by the impedance matching circuit 210. The RF signal that is received from the source by the impedance matching circuit 210 is combined within the impedance matching circuit 210 to generate an RF supply signal 228 that is supplied via the RF rod 216A to the plasma reactor 214.

Examples of the source include one or more of the x, y, and z MHz RF generators and one or more of RF cable systems that couple the RF generators to the impedance matching circuit 210, and any other circuits coupled between the RF generator and the impedance matching circuit 210. Examples of the load include the RF transmission line 216 and the plasma reactor 214, and any other circuitry, e.g., the filter 218, etc., coupled between the plasma reactor 214 and the impedance matching circuit 210. The RF generator 225 generates an RF supply signal 202 that is supplied, e.g., delivered, etc., via the RF cable 212A to the impedance matching circuit 210. For example, a driver and amplifier system of the RF generator 204 generates the RF supply signal 202. The impedance matching circuit 210 combines the RF supply signal 202 with one or more RF signals that are received from one or more other RF generators to generate the RF supply signal 228, which is supplied to the plasma reactor 214 via the RF rod 216A. The impedance matching circuit 210 combines the RF supply signal 202 with one or more RF signals received from one or more of the other RF generators to match an impedance of the source with that of the load. In some embodiments, the RF supply signal 228 is generated when the impedance of the source matches with that of the load.

The filter 218 changes, e.g., reduces, etc., at the point 258 a power of the RF supply signal 228 by filtering the RF supply signal 228 to generate an RF supply signal 250. For example, the filter 218 provides a capacitance, or an inductance, or a combination thereof, etc., in a path of the RF supply signal 228 to generate the RF supply signal 250. As yet another example, a portion of the RF supply signal 228 is grounded via the filter 218 to generate the RF supply signal 250.

A plasma chamber 215 of the plasma reactor 214 is provided with a process gas, e.g., an oxygen-containing gas, or oxygen, or a fluorine-containing gas, or tetrafluoromethane ($CF_4$), or sulfur hexafluoride ($SF_6$), or hexafluoroethane ($C_2F_6$), or a combination thereof, etc. The RF supply signal 250 is received by a lower electrode 224 of the plasma chamber 215 to ignite the process gas to generate plasma within the plasma chamber 215. The RF supply signal 250 is received via the RF rod 216A, an RF coupling 260, and an RF cylinder 222. The RF coupling 260 is coupled to the RF rod 216A of the RF transmission line 216 and is coupled to the RF cylinder 222, which is connected to the lower electrode 224.

In some embodiments, the lower electrode 224 is a part of a chuck of the plasma chamber 215. For example, the lower electrode 224 is embedded within the chuck.

A top surface 280 of the lower electrode 224 faces a bottom surface 282 of the upper electrode 226. In some embodiments, the upper electrode 226 is grounded.

The upper electrode 226 faces the lower electrode 224. A substrate 284 is placed on top of the lower electrode 224 for processing. Examples of processing the substrate 284 include cleaning the substrate 284, or etching the substrate 284, or etching an oxide on top of the substrate 284, or depositing materials, e.g., oxides, dioxides, photo resist materials, etc., on the substrate 284, or a combination thereof.

The plasma generates an RF return signal 290, which is reflected from the plasma reactor 214 towards the RF generator 225 via an RF return path 221. The RF return signal 290 is transferred via the RF tunnel 216B to the housing 209 of the matchbox 208.

The RF return signal 290 is transferred via at least a portion of the housing 209 and via the RF cable sheath 212B to the RF generator 225. For example, the RF return signal 290 is reflected towards the RF driver and amplifier system of the RF generator 204 via the RF cable sheath 212B.

In some embodiments, the RF supply path 220 includes the RF cable 212A, the impedance matching circuit 210, the RF connection 302, the RF rod 216A, the RF coupling 260, and the RF cylinder 222 of the plasma reactor 214. In embodiments in which two or more RF generators are used, an RF supply path includes RF cables that connect the RF generators to the impedance matching circuit 210, separate paths within the impedance matching circuit 210, and a combined path within the impedance matching circuit 210. Each separate path in the impedance matching circuit 210 connects to a corresponding RF generator to transfer an RF signal and the combined path receives a combination of the RF signals transferred via the separate paths. In FIG. 4A, the RF supply path 220 is indicated as dots traveling from the RF generator 225 to the lower electrode 224 of the plasma chamber 215 and is separate from an RF return path 221. The RF supply path 220 is a path of one or more RF supply signals.

In some embodiments, the RF return path 221 includes a C-shroud of the plasma chamber 215, a ground ring of the plasma reactor 214, RF straps of the plasma reactor 214, a bottom electrode housing of the plasma reactor 214, a ground shield of the plasma reactor 214, the RF tunnel 216B, a grounded portion of the housing 209 connected to the RF tunnel 216B, and the RF cable sheath 212B. The RF return path 221 is indicated as dots traveling from the plasma reactor 214 to the RF generator 225 in FIG. 4A. The RF return path 221 is a path of one or more RF return signals.

In various embodiments, at least a portion of the RF return path 221 is grounded, e.g., coupled to a ground potential, coupled to a reference potential, etc.

Figure 4B:
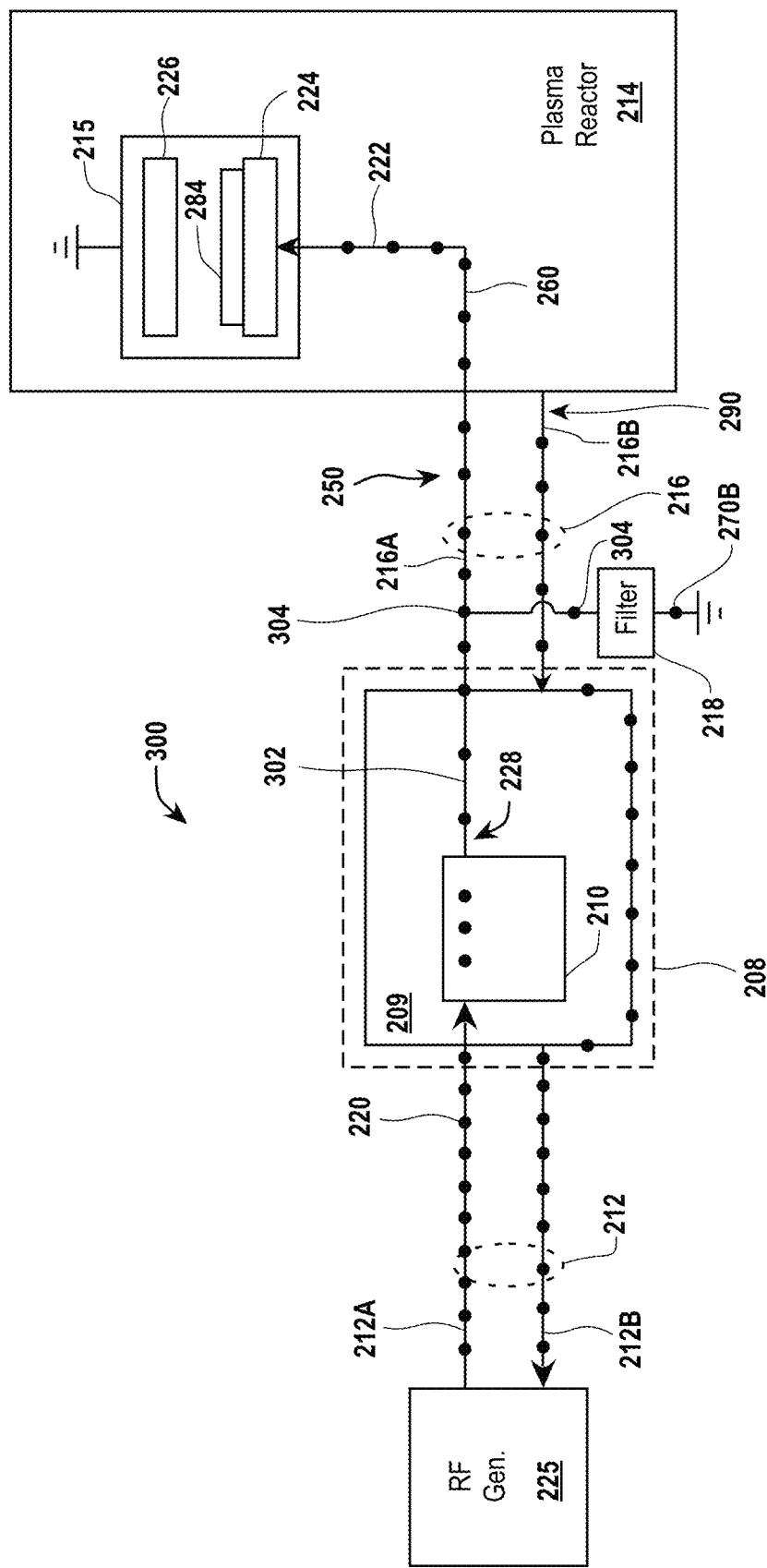
FIG. 4B is a diagram of a plasma tool for controlling an impedance of an RF supply path, in accordance with one embodiment described in the present disclosure.

FIG. 4B is a diagram of an embodiment of a plasma tool 300 for controlling an impedance of the RF supply path 220. The plasma tool 300 includes the RF generator 225, the RF cable system 212, the matchbox 208, the RF transmission line 216, and the plasma reactor 214. The plasma tool 300 is similar to the plasma tool 200 (FIG. 4A) except that the filter 218 is located outside the housing 209 of the matchbox 208. For example, the filter 218 is coupled to the RF rod 216A at a point 304 on the RF rod 216A.

The filter 218 is connected to the point 304 at the end 270A and is grounded at the end 270B. For example, the end 270A is connected to the RF rod 216A, which receives the RF supply signal 228.

When the filter 218 is located outside the housing 209, the filter 218 is easily accessible. For example, when the housing 209 includes a door to access an enclosure of the housing 209, it is easy to access the filter 218 that is outside the housing 209 than one inside the housing 209. In some embodiments, the filter 218 that is outside the housing 209 is enclosed within a housing (not shown) to protect the filter 218.

In some embodiments, instead of the housing 209, another housing that is smaller than the housing 209 is used to enclose the impedance matching circuit 210. For example, a volume of the smaller housing is less than a volume of the housing 209.

The filter 218 receives the RF supply signal 228 at the point 304 and modifies a power of the RF supply signal 228 to generate the RF supply signal 250. For example, the filter 218 reduces the power of the RF supply signal 228 by providing an impedance to the RF supply signal 228. As another example, the filter 218 has a capacitance, an inductance, or a combination thereof, that is applied to the RF supply signal 228 to modify an impedance of the RF supply signal 228.

FIG. 5 is a diagram of an embodiment of a system 310 for illustrating different points at which the filter 218 is connected along an RF supply path 312. The system 310 includes a plasma reactor 316, which is an example of the plasma reactor 214 (FIGS. 4A, 4B).

The plasma reactor 316 includes a plasma chamber 320 and an RF cylinder 222. The plasma reactor 316 further includes return RF straps 360 and 362, a ground ring 332 and a bottom electrode housing 372. The plasma chamber 320 includes an upper electrode 322, an upper electrode extension 328, a C-shroud 330, the ground ring 332, and a chuck assembly. The chuck assembly includes a chuck 334 and a facility plate 336. A substrate 338, which is an example of the substrate 284 (FIGS. 4A, 4B), is placed on top of the chuck 334 for processing the substrate 338. Examples of processing the substrate 338 include cleaning the substrate 338, or etching the substrate 338, or etching an oxide on top of the substrate 338, or depositing materials, e.g., oxides, dioxides, photo resist materials, etc., on the substrate 338, or a combination thereof. The upper electrode 322 is an example of the upper electrode 226 (FIGS. 4A, 4B).

The C-shroud 330 includes slots that are used to control pressure within the plasma chamber 320. For example, the slots are opened to increase gas flow through the slots to decrease gas pressure in a gap 340 of the plasma chamber 320. The slots are closed to decrease the gas flow to increase gas pressure in the gap 340. The gap 340 is formed between the upper electrode 322 and a lower electrode of the chuck 334.

In various embodiments, the bottom electrode housing 372 is of any shape, e.g., cylindrical, square, polygonal, etc.

In various embodiments, the RF cylinder 222 is not a cylinder and has a polygonal shape, e.g., a rectangular shape, a square shape, etc.

The upper electrode extension 328 surrounds the upper electrode 322. The C-shroud 330 includes portions 330A and 330B. The ground ring 332 includes a ground ring portion 332A and another ground ring portion 332B. The bottom electrode housing 372 includes a bottom electrode housing portion 372A, another bottom electrode housing portion 372B, and yet another bottom electrode housing portion 372C. Each bottom electrode housing portion 372A and 372B forms a side wall of the bottom electrode housing 372. The bottom electrode housing 372C forms a bottom wall of the bottom electrode housing 372. The plasma reactor 316 includes a ground shield 240, which further includes a ground shield portion 240A and another ground shield portion 240B. Examples of a C-shroud, a ground shield, and a return RF strap are provided in application Ser. No. 13/684,098, filed on Nov. 21, 2012, and having U.S. Publication No. 2013-0133834, which is incorporated by reference herein in its entirety.

A top surface 381 of the chuck 334 faces a bottom surface 380 of the upper electrode 322. The plasma chamber 320 is surrounded by the upper electrode 322 and the upper electrode extension 328. The plasma chamber 320 is further surrounded by the C-shroud 330, and the chuck 334.

The ground ring 332 is located below the C-shroud 330. In some embodiments, the ground ring 332 is located below and adjacent to the C-shroud 330. The return RF strap 360 is connected to the ground ring portion 332A and the return RF strap 362 is connected to the ground ring portion 332B. The return RF strap 360 is connected to the bottom electrode housing portion 372A and the return RF strap 362 is connected to the bottom electrode housing portion 372B. The bottom electrode housing portion 372A is connected to the ground shield portion 240A and the bottom electrode housing portion 372B is connected to the ground shield portion 240B. The ground shield portion 240A is connected via the bottom electrode housing portion 372A to a grounded RF tunnel 232 and the ground shield portion 240B is connected via the bottom electrode housing portions 372B and 372C to the grounded RF tunnel 232. The grounded RF tunnel 232 is an example of the RF tunnel 216B (FIGS. 4A, 4B).

In some embodiments, the bottom electrode housing portion 276 is a cylinder that surrounds the RF cylinder 222. The RF cylinder 222 is a medium for passage of the RF supply signal 250. The RF cylinder 222 is connected to an RF rod 230 via the RF coupling 260, which includes one or more RF straps, one or more RF rods, or a combination of one or more RF straps and one or more RF rods. The RF rod 230 is an example of the RF rod 216A (FIGS. 4A, 4B).

A connection point 241 is located at an output of the impedance matching circuit 210. The impedance matching circuit 210 is located within a housing 252 of a matchbox 251. The matchbox 251 is an example of the matchbox 208 (FIGS. 4A, 4B) and the housing 252 is an example of the housing 209 (FIGS. 4A, 4B).

An RF strap 238 is connected at the connection point 241 to the output of the impedance matching circuit 210. A signal that is output from the impedance matching circuit 210 is provided to an input of the RF strap 238. For example, a combination of signals from two or more of the x, y, and z RF generators is provided from the output of the impedance matching circuit 210 to the RF strap 238.

The RF strap 238 has an output at a connection point 242. The connection point 242 is connected to another RF strap 244. The RF straps 238 and 244 are located within the housing 252.

It should be noted that in some embodiments, any number of RF straps are connected between the connection points 241 and 242. Moreover, in some embodiments, a portion of the RF strap 244 extends outside the housing 252 via an opening of the housing 252.

The RF strap 244 is connected to the RF rod 230 at a connection point 246, which is located at or close to a sidewall 252A of the housing 252. The RF rod 230 extends via an opening in the bottom electrode housing portion 372B into an enclosure 390 formed by the bottom electrode housing 372 and the facility plate 336.

A connection point 398 is located at the RF cylinder 222. For example, the connection point 398 is located at an input of the RF cylinder 222. The input of the RF cylinder 222 is connected to an output of the RF coupling 260. In various embodiments, the connection point 398 is located anywhere along the RF cylinder 222. For example, the connection point 398 is located at a center of a body of the RF cylinder 222 or at an output of the RF cylinder 222. The output of the RF cylinder 222 is connected to the chuck 334 via the facility plate 336.

In some embodiments, the filter 218 is connected to the RF coupling 260 at the end 270A and is connected via the end 270B to the bottom electrode housing portion 372A, or the bottom electrode housing portion 372B, or the bottom electrode housing portion 372C to be grounded.

When the filter 218 is connected to the connection point 241, the RF supply signal 228 that is output from the impedance matching circuit 110 is modified by the filter 218 at the connection point 241 to generate the RF supply signal 250. The RF supply signal 250 is supplied via the RF strap 238, the RF strap 244, the RF rod 230, the RF coupling 260, and the RF cylinder 222 to the chuck 334 to generate plasma within the plasma chamber 320.

Moreover, when the filter 218 is connected to the connection point 242, the RF supply signal 228 that is output from the impedance matching circuit 110 is supplied via the RF strap 238 to the filter 218. The RF supply signal 228 is modified by the filter 218 at the connection point 242 to generate the RF supply signal 250. The RF supply signal 250 is supplied via the RF strap 244, the RF rod 230, the RF coupling 260, and the RF cylinder 222 to the chuck 334 to generate plasma within the plasma chamber 320.

When the filter 218 is connected to the connection point 246, the RF supply signal 228 that is output from the impedance matching circuit 110 is supplied via the RF strap 238 and the RF strap 244 to the filter 218. The RF supply signal 228 is modified by the filter 218 at the connection point 246 to generate the RF supply signal 250. The RF supply signal 250 is supplied via the RF rod 230, the RF coupling 260, and the RF cylinder 222 to the chuck 334 to generate plasma within the plasma chamber 320.

Furthermore, when the filter 218 is connected to the connection point 398, the RF supply signal 228 that is output from the impedance matching circuit 110 is supplied via the RF strap 238, the RF strap 244, the RF rod 230, and the RF coupling 260 to the filter 218. The RF supply signal 228 is modified by the filter 218 at the connection point 398 to generate the RF supply signal 250. The RF supply signal 250 is supplied via the RF cylinder 222 to the chuck 334 to generate plasma within the plasma chamber 320.

The end 270A of the filter 218 is connected to the connection point 241, or the connection point 242, or the connection point 246, or the connection point 398. In some embodiments, when the end 270A is connected to the connection point 241 or the connection point 242 or the connection point 246, the end 270B is connected to the housing 252, which is grounded. In various embodiments, when the end 270A is connected to the connection point 246, the end 270B is connected to the grounded RF tunnel 232. In several embodiments, when the end 270A is connected to the connection point 398, the end 270B is connected to the ground shield portion 240A or to the ground shield portion 240B or to the bottom electrode housing portion 372A or to the bottom electrode housing portion 372B or to the bottom electrode housing portion 372C.

In various embodiments, the filter 218 is located within and is coupled to the grounded RF tunnel 232 or is located within the enclosure 390 surrounded by the bottom electrode housing 372 and the facility plate 336 (FIG. 5).

In some embodiments, four filters, e.g., four of the filters 218, etc., are connected to the connection point 241, the connection point 242, the connection point 246, and the connection point 398. For example, the filter 218 is connected to the connection point 241, another one of the filter 218 is connected to the connection point 242, yet another one of the filter 218 is connected to the connection point 246, and still another one of the filter 218 is connected to the connection point 398. As another example, the filter 218, e.g., a first filter, etc., is connected to the connection point 241, a second filter is connected to the connection point 242, a third filter is connected to the connection point 246, and a fourth filter is connected to the connection point 398. Any of the second, third, and fourth filters has an impedance that is same or different from an impedance of the first filter. In some embodiments, two or more of the second, third, and fourth filters have impedances that are different from an impedance of the first filter. In some embodiments, an impedance of a filter is based on a capacitance and/or an inductance of the filter.

In various embodiments, the filter 218 is connected to any point along an RF supply path 312, which extends via the RF strap 238, the RF strap 244, the RF rod 230, the RF coupling 260, and the RF cylinder 222. The RF supply path 312 is a portion of the RF supply path 220 (FIGS. 4A, 4B).

In various embodiments, any number of filters are connected to the RF supply path 220.

A portion of the RF return signal 290, which is generated by plasma within the plasma chamber 320, passes from the bottom surface 380 of the upper electrode 322 to a bottom surface portion 383A of the upper electrode extension 328, further to the C-shroud portion 330A, further to the ground ring portion 332A, further to the return RF strap 360, further to the bottom electrode housing portion 372A, further to the ground shield portion 240A, further to the bottom electrode housing portion 372C, further to the bottom electrode housing portion 372B, to the grounded RF tunnel 232.

In some embodiments, the portion of the RF return signal 290 passes from the bottom surface 380 of the upper electrode 322, further along the bottom surface portion 383A of the upper electrode extension 328, further along the C-shroud portion 330A, further along the ground ring portion 332A, further along the return RF strap 360, further along the bottom electrode housing portion 372A, further along the ground shield portion 240A, further along the bottom electrode housing portion 372C, further along the bottom electrode housing portion 372B, to the grounded RF tunnel 232.

Moreover, another portion of the RF return signal 290 passes from the bottom surface 380 to a bottom surface portion 383B of the upper electrode extension 328, further to the C-shroud portion 330B, further to the ground ring portion 332B, further to the return RF strap 362, further to the bottom electrode housing portion 372B, further to the ground shield portion 240B, to the grounded RF tunnel 232.

In various embodiments, a portion of an RF return signal, which is generated by plasma within the plasma chamber 320 passes from the bottom surface 380, along the bottom surface portion 383B of the upper electrode extension 328, further along the C-shroud portion 330B, further along the ground ring portion 332B, further along the return RF strap 362, further along the bottom electrode housing portion 372B, further along the ground shield portion 240B, to the grounded RF tunnel 232.

It should be noted that a portion of an RF return path of the RF return signal 290 extends from the bottom surface 380 of the upper electrode 322, along the bottom surface portion 383A of the upper electrode extension 328, further along the C-shroud portion 330A, further along the ground ring portion 332A, further along the return RF strap 360, further along the bottom electrode housing portion 372A, further along the ground shield portion 240A, further along the bottom electrode housing portion 372C, further along the bottom electrode housing portion 372B, to the grounded RF tunnel 232.

Moreover, a portion of an RF return path of the RF return signal 290 extends from the bottom surface 380 of the upper electrode 322, along the bottom surface portion 383B of the upper electrode extension 328, further along the C-shroud portion 330B, further along the ground ring portion 332B, further along the return RF strap 362, further along the bottom electrode housing portion 372B, further along the ground shield portion 240B, to the grounded RF tunnel 232.

In various embodiments, the filter 218 that is grounded sinks at least a portion of a current of the RF signal 228 to ground.

In some embodiments, instead of the RF strap 238, any number of RF straps is connected to the output of the impedance matching circuit 210. Moreover, in various embodiments, instead of the RF strap 244, any number of RF straps is connected to the RF strap 238 and to the RF rod 230.

FIG. 6A is a diagram of an embodiment of a system 402 for modifying an impedance of the RF supply signal 228 that is provided by the impedance matching circuit 210 (FIGS. 4A, 4B). The filter 218 is connected at a connection 404, which is an example of the connection point 241, or 242, or 246, or 398 (FIG. 5). The filter 218 is coupled via an RF strap 430 to the connection 404.

In some embodiments, the connection 404 is at a point along, e.g., on, etc., the RF supply path 312 (FIG. 5) or the RF supply path 220 (FIGS. 4A, 4B).

A controller 254 is coupled to a driver 408, e.g., a motor driver, or a current generator, or a set of transistors, etc. The driver 408 is coupled to a movement mechanism 410, e.g., a motor, or a rotor, etc., which is coupled to the filter 218. For example, the movement mechanism 410 is coupled to one or more plates of capacitors of the filter 218. As another example, the movement mechanism 410 is coupled to an end of an inductor of the filter 218.

A controller, as used herein, includes a processor and a memory device. As used herein, a processor refers to or a central processing unit, or a microprocessor, or an application specific integrated circuit, or a digital signal processor, or a programmable logic device. Examples of a memory device include a random access memory (RAM) and a read-only memory (ROM). In some embodiments, a memory device is a flash memory, or a hard disk, or a redundant array of storage disks (RAID), or a combination thereof.

The controller 254 includes a processor 412 and a memory device in which a tune recipe 256 is stored. The tune recipe 256 includes a correspondence between etch rates E1 thru E4 and tuning parameters T1 thru T4. For example, an etch rate E1 is mapped to a tuning parameter T1, an etch rate E2 is mapped to a tuning parameter T2, an etch rate E3 is mapped to a tuning parameter T3, and an etch rate E4 is mapped to a tuning parameter T4. The tune recipe 256 includes a correspondence between uniformities U1 thru U4 in etch rates and the tuning parameters T1 thru T4. For example, the tuning parameter T1 is mapped to uniformity U1 in etch rates, the tuning parameter T2 is mapped to uniformity U2 in etch rates, the tuning parameter T3 is mapped to uniformity U3 in etch rates, and the tuning parameter T4 is mapped to uniformity U4 in etch rates.

In some embodiments, an etch rate, or a uniformity in etch rates, or a deposition rate, or a uniformity in deposition rates is referred to herein as a measurable factor.

Examples of a tuning parameter include an impedance, or an inductance (L), or a capacitance (C), or a voltage, or a current, or a complex voltage and current, or a combination thereof. Examples of a uniformity in etch rates include a curve indicating a relationship between an etch rate and a radius of the substrate. For example, each curve that plots an oxide etch rate of etching a substrate versus a radius of the substrate represents a uniformity in etching the substrate. In some embodiments, a uniformity in etch rates includes etch rates that lie within a pre-determined standard deviation of an etch rate.

In various embodiments, the tune recipe 256 includes a correspondence between any number of etch rates and the same number of tuning parameters. In several embodiments, the tune recipe 256 includes a correspondence between any number of uniformities and the same number of tuning parameters.

In some embodiments, instead of the etch rates E1 thru E4, deposition rates D1 thru D4 are used and the deposition rates have a one-to-one correspondence with the tuning parameter T1 thru T4. For example, a deposition rate D1 corresponds to the tuning parameter T1, a deposition rate D2 corresponds to the tuning parameter T2, etc. Moreover, in these embodiments, the uniformities U1 thru U4 are uniformities in deposition rates and each uniformity has a one-to-one correspondence with a tuning parameter. For example, the uniformity U1 in deposition rates is mapped to the tuning parameter T1, the uniformity U2 in deposition rates is mapped to the tuning parameter T2, and so on. In some embodiments, each curve that plots an oxide deposition rate of depositing an oxide on a substrate versus a radius of the wafer represents a uniformity in deposition on the substrate. In some embodiments, a uniformity in deposition rates includes deposition rates that lie within a pre-determined standard deviation of a deposition rate.

The processor 412 is programmed to achieve an etch rate or a uniformity by achieving a corresponding tuning parameter.

For example, the processor 412 is programmed to achieve the etch rate E2 or the uniformity U2 by achieving the tuning parameter T2. The processor 412 sends a signal 414 to the driver 408 to generate one or more amounts of current to achieve an etch rate or a uniformity. Upon receiving the signal 414, the driver 408 generates one or more amounts of current 416 to provide to the movement mechanism 410. Upon receiving the current 416, the movement mechanism 410 performs one or more rotational motions or one or more translation motions to move the filter 218 to achieve a tuning parameter to generate the RF supply signal 250. For example, the movement mechanism 410 changes a distance between plates of a capacitor of the filter 218 or changes a length of an inductor of the filter 218. The generation of the RF supply signal 250 helps achieve an etch rate or uniformity.

FIG. 6B is a diagram of an embodiment of the filter 218 as a capacitive element and/or an inductive element. The filter 218 includes a number of capacitors and/or a number of inductors. The capacitors are in series with each other and the inductors are in series with each other. Moreover, an inductor of the filter 218 is in series with a capacitor of the filter 218.

FIG. 6C is a diagram of an embodiment of a capacitive filter 420, which is an example of the filter 218. The filter 420 includes a variable capacitor 234 that has an end 422A and another end 422B. The end 422A is an example of the end 270A (FIGS. 4A, 4B) and the end 422B is an example of the end 270B (FIGS. 4A, 4B). A capacitance of the capacitor 234 is changed by varying a distance between plates of the capacitor 234. For example, the movement mechanism 410 (FIG. 6A) is coupled to the end 422A or the end 422B to change the distance between the plates. The change in the capacitance changes an impedance of the RF supply signal 228 to generate an RF supply signal 426, which is an example of the RF supply signal 250.

Figure 6E:
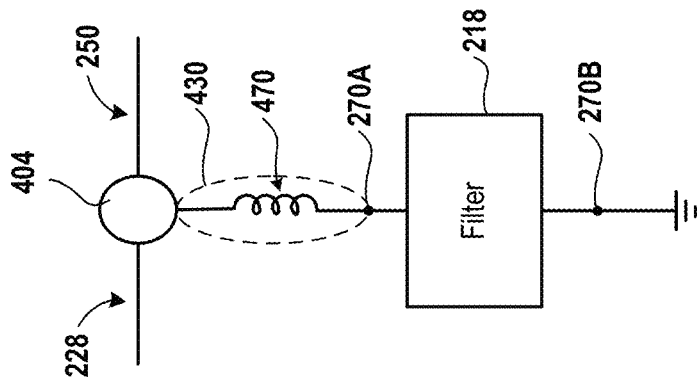
FIG. 6E is a diagram of a connection between a filter and an RF strap to illustrate an internal inductance of the RF strap, in accordance with one embodiment described in the present disclosure.
Figure 6D:
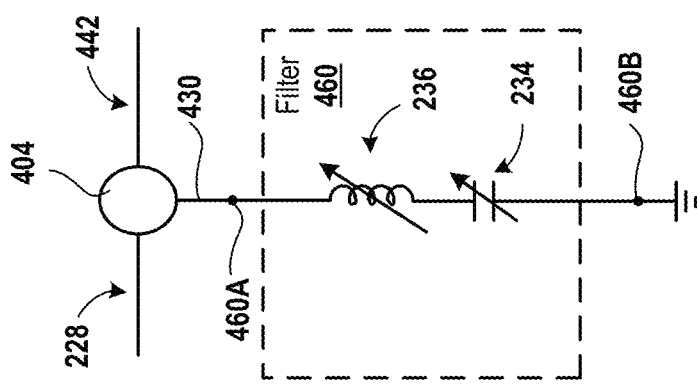
FIG. 6D is a diagram of a capacitive and inductive filter, in accordance with one embodiment described in the present disclosure.

FIG. 6D is a diagram of an embodiment of a capacitive and inductive filter 460, which is an example of the filter 218. The filter 460 includes a variable inductor 236 in series with the variable capacitor 234. The filter 460 has an end 460A and another end 460B. The end 460A is an example of the end 270A (FIGS. 4A, 4B) and the end 460B is an example of the end 270B (FIGS. 4A, 4B). A change in the inductance of the inductor 236 and/or a change in a capacitance of the capacitor 234 changes an impedance of the RF supply signal 228 to generate an RF supply signal 442, which is an example of the RF supply signal 250.

FIG. 6E is a diagram of an embodiment of a connection between the filter 218 and the RF strap 430 to illustrate an internal inductance of the RF strap 430. The end 270A of the filter 218 is connected to the RF strap 430, which has an internal inductance 470.

In some embodiments, different RF straps are used to vary inductances of the RF straps. For example, when the RF strap 430 is replaced with another RF strap, an inductance of the RF strap 430 is changed to change an impedance of the RF supply signal 228.

Figure 7:
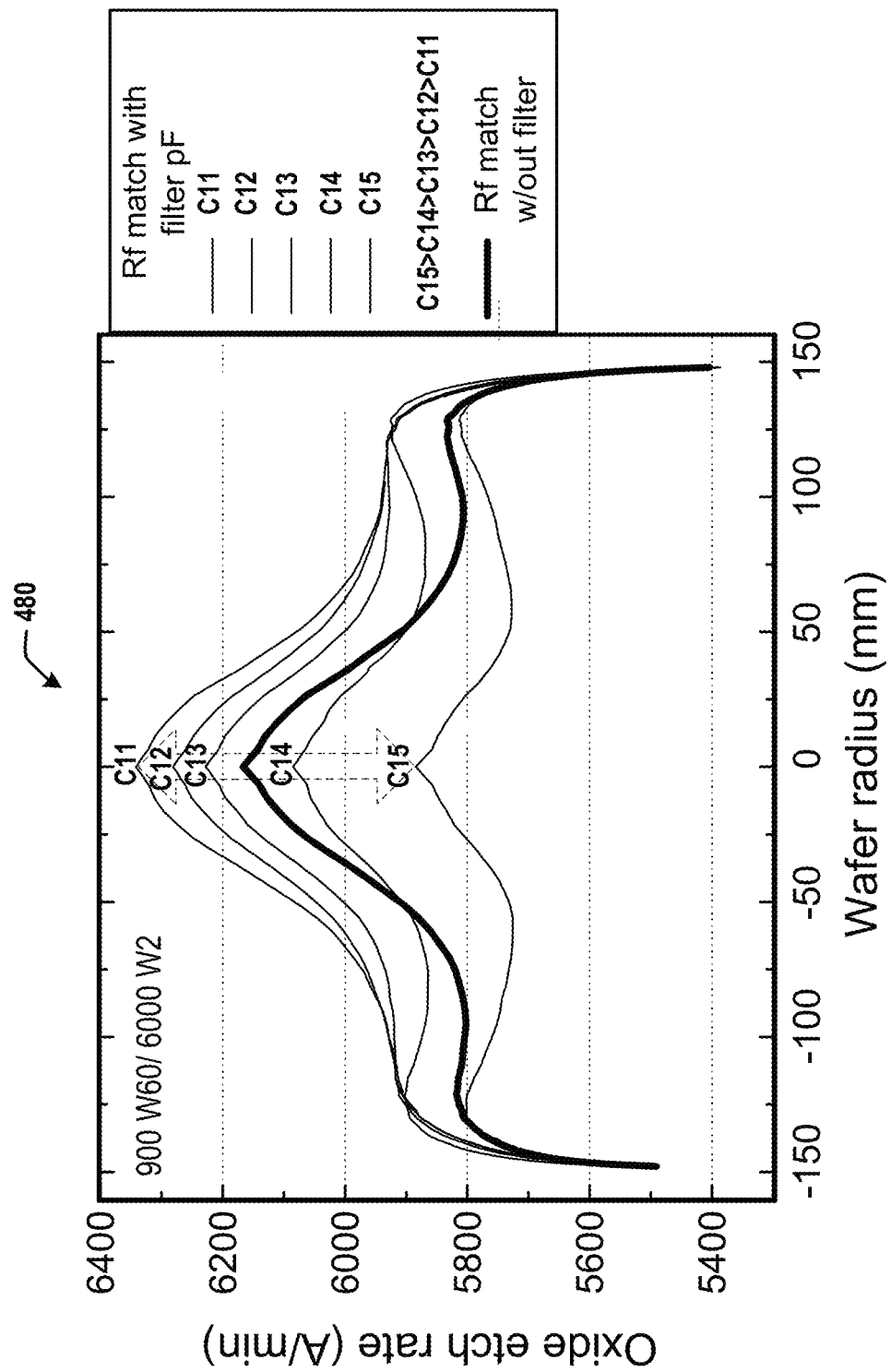
FIG. 7 is a graph that plots an etch rate of etching a substrate with respect to a radius of the substrate for different amounts of capacitances of a filter, in accordance with one embodiment described in the present disclosure.

FIG. 7 is an embodiment of a graph 480 that plots an etch rate of etching a substrate with respect to a radius of the substrate for different amounts of capacitances. As a capacitance of the filter 218 is increased from C11 to C15, there is an increase in uniformity in the etch rates. By controlling capacitance of the filter 218, a control, e.g., reduction, etc., in non-uniformity in the etch rates is achieved. Also, it is shown in graph 480 that when the filter 218 is not used, there is a non-uniformity in etch rates.

In some embodiments, a non-uniformity in etch rates is measured close to the center of the substrate, e.g., within a pre-determined range, from the center of the substrate, etc.

Figure 8:
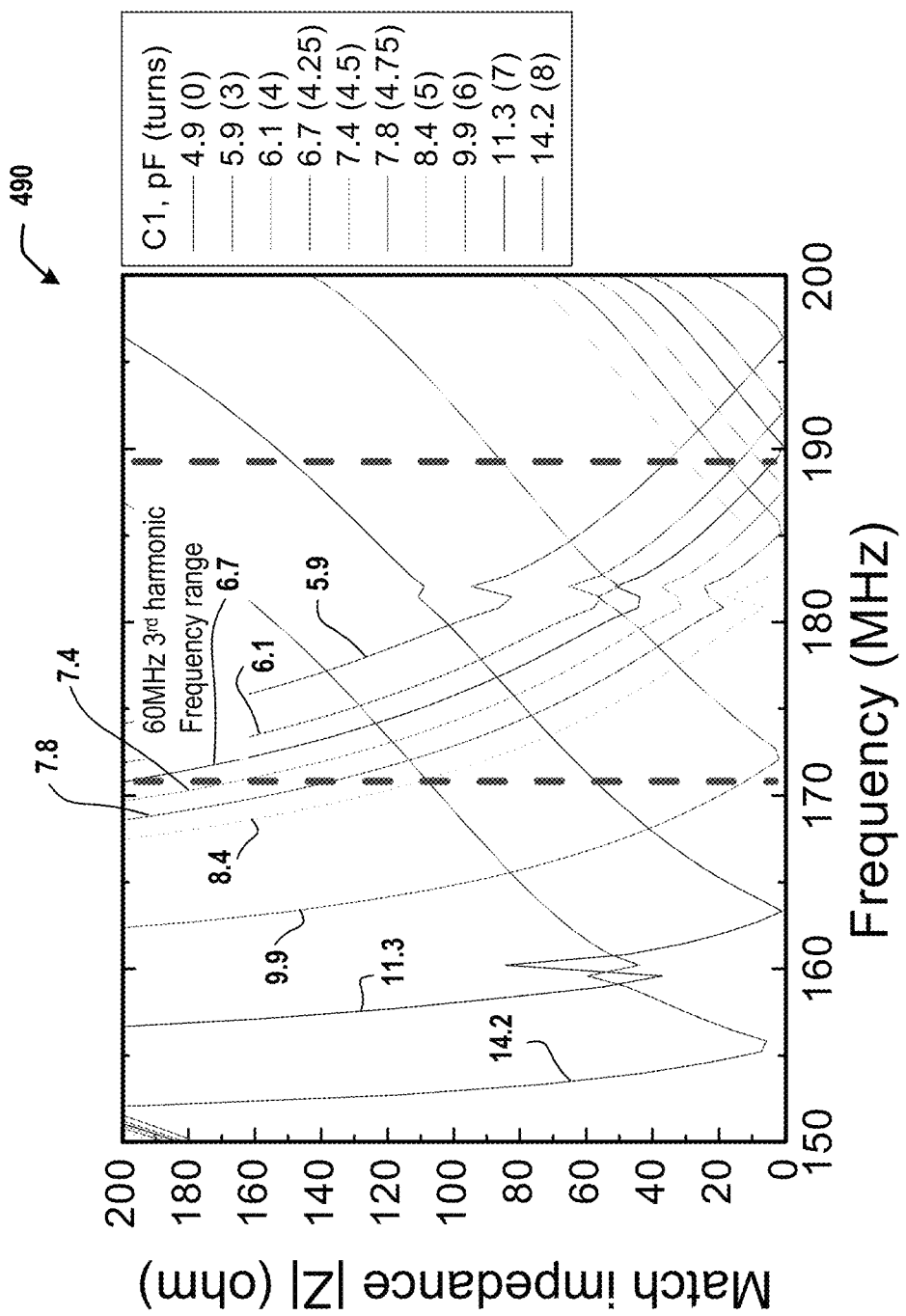
FIG. 8 is a graph that plots an impedance at an output of a matchbox versus frequencies close to a third harmonic of an RF supply signal measured at the output when the output is connected to a network analyzer, in accordance with one embodiment described in the present disclosure.

FIG. 8 is an embodiment of a graph 490 that plots an impedance at an output of the matchbox 208 (FIG. 4A), e.g., match impedance, etc., versus frequencies close to a third harmonic of an RF supply signal measured at the output when the output of the matchbox 208 is connected to a network analyzer. The network analyzer is coupled to the output of the matchbox 208 after the output is decoupled from the plasma chamber 215 (FIG. 4A). It should be noted that the graph 490 plots impedances for various values of capacitances C of the filter 218 (FIGS. 6A-6E).

As the capacitance C increases, a phase of a curve that plots the match impedance changes in a range close to the third harmonic of the RF supply signal measured at the output of the matchbox 208. The matchbox 208 impedance decreases to corresponding minimum values at resonance points. In some embodiments, the filter 218 (FIGS. 4A, 4B) is referred to herein as a phase adjusting circuit that changes a phase of the RF supply signal 228 to generate the RF supply signal 250 (FIGS. 4A, 4B). In various embodiments, the phase of the RF supply signal 228 is adjusted to achieve the measurable factor. The change in phase is used to control an impedance of the RF supply signal 228 to reduce non-uniformity in etch rates or to achieve an etch rate.

Figure 9:
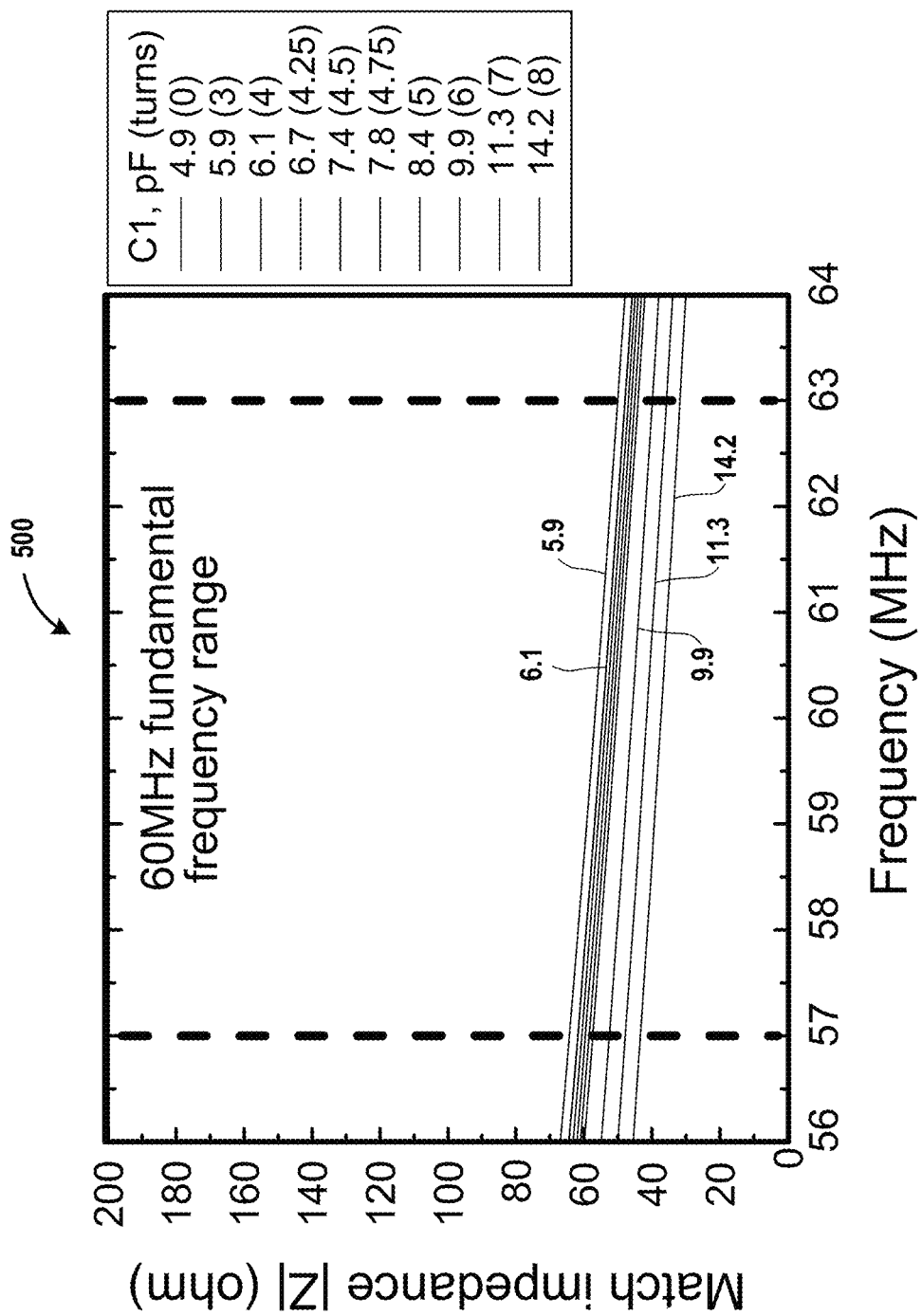
FIG. 9 is a graph that plots a match impedance versus frequencies close to a fundamental frequency of an RF supply signal measured at an output of a matchbox to illustrate a lack of change in phase of the RF signal close to the fundamental frequency, in accordance with one embodiment described in the present disclosure.

FIG. 9 is an embodiment of a graph 500 that plots the match impedance versus frequencies close to a fundamental frequency of the RF supply signal measured at the output of the matchbox 208 to illustrate a lack of change in phase and a resonance condition where matchbox impedance is close to zero. As shown in the graph 500, as values of capacitances C of the filter 218 and/or various turns of different RF straps, e.g., RF straps similar to the RF strap 430 (FIGS. 6A-6E), etc., change, there is no change in phase of a curve that plots the match impedance in a range close to the fundamental frequency of the RF supply signal measured at the output of the matchbox 208. Hence, the fundamental frequency is minimally affected by a change in the capacitance C and/or change in the turns of different RF straps.

Figure 10A:
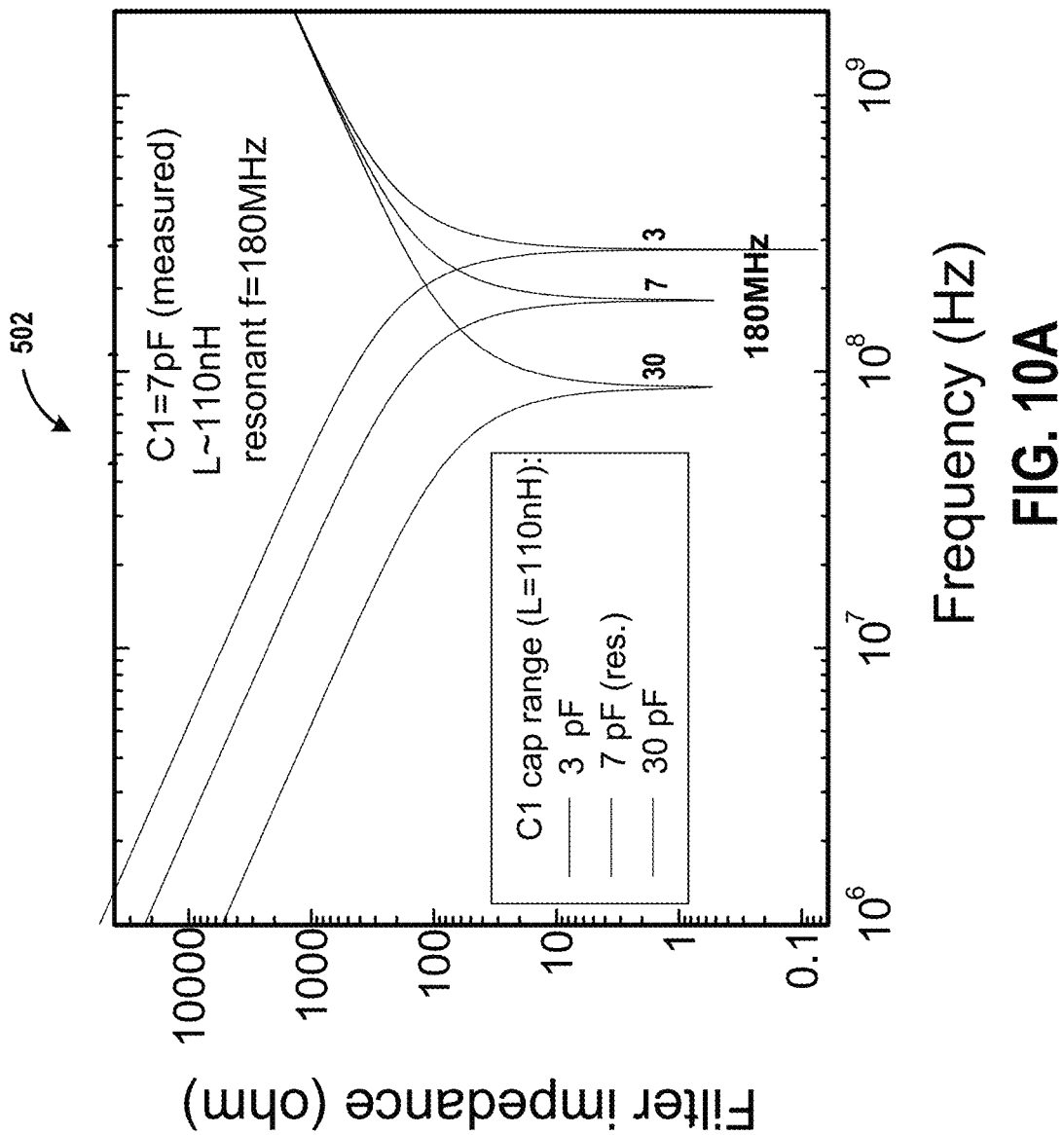
FIG. 10A is a graph that plots an impedance at an output of a filter versus frequencies close to a third harmonic of an RF supply signal calculated at the output for different capacitance values of the filter, in accordance with one embodiment described in the present disclosure.

FIG. 10A is an embodiment of a graph 502 that plots an impedance at an output of the filter 218 (FIG. 4A), e.g., filter impedance, etc., versus frequencies close to a third harmonic of an RF supply signal calculated at the output. As shown in graph 502, there is a change in phase of the filter impedance, e.g., when the filter impedance is close to zero, etc., with a change in the capacitance C.

Figure 10B:
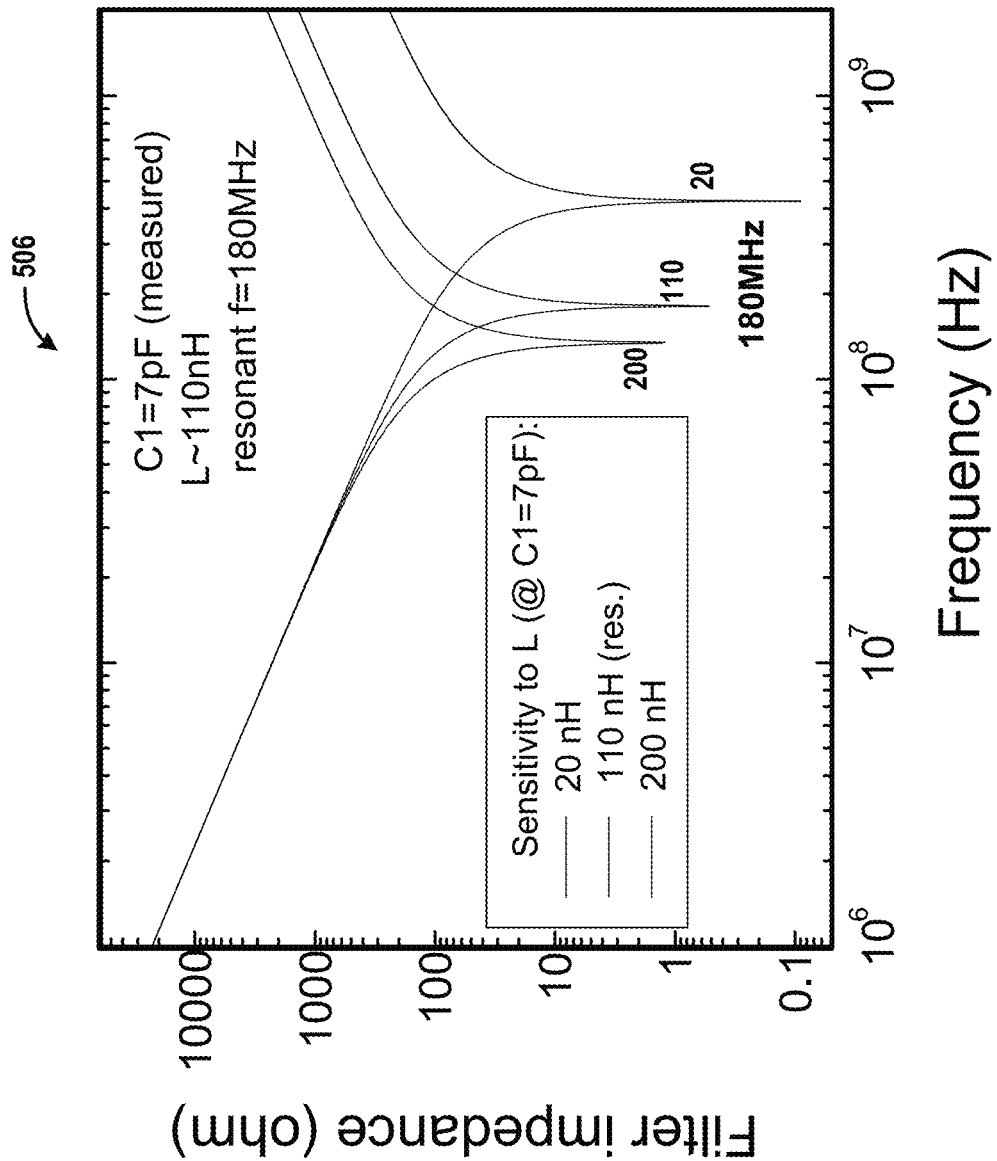
FIG. 10B is a graph that plots a filter impedance versus a frequency of a third harmonic of an RF supply signal calculated at an output of the filter, in accordance with one embodiment described in the present disclosure.

FIG. 10B is an embodiment of a graph 506 that plots the filter impedance versus a frequency of a third harmonic of an RF supply signal calculated at the output of the filter 218. As shown in graph 506, there is a change in phase of the filter impedance, e.g., when the filter impedance is close to zero, etc., with a change in an inductance of an RF strap, e.g., an RF strap similar to the RF strap 430, etc.

It should be noted that although the graphs in FIGS. 8, 9, and 10B are described with reference to a change in inductance of an RF strap, the graphs equally apply when there is a change in an inductance of the variable inductor 236 (FIG. 6D).

Figure 11:
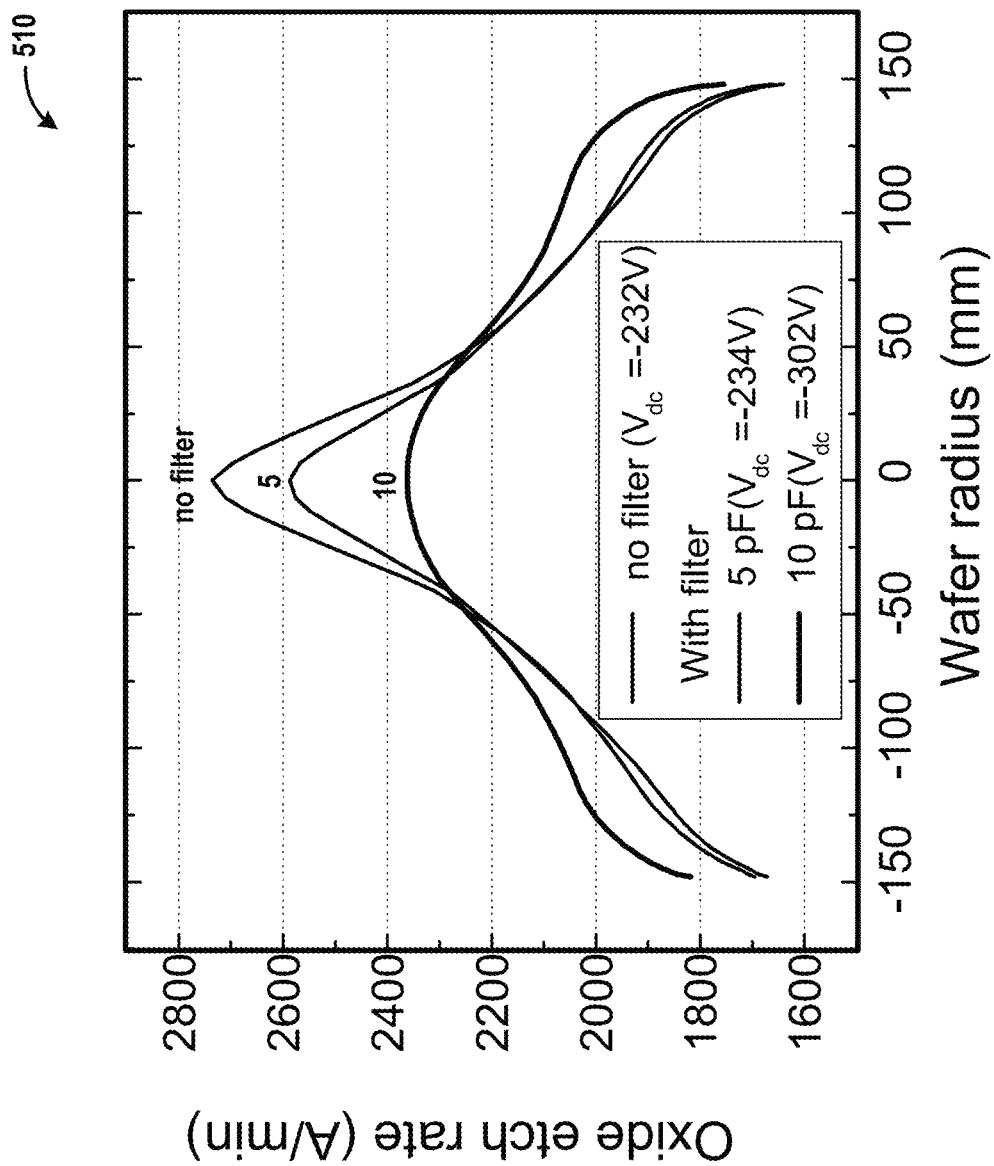
FIG. 11 is a graph that plots an etch rate of etching a substrate with respect to a radius of the substrate for different amounts of capacitances, in accordance with one embodiment described in the present disclosure.

FIG. 11 is an embodiment of a graph 510 that plots an etch rate of etching a substrate with respect to a radius of the substrate for different capacitance. As a capacitance of the filter 218 is increased, there is an increase in uniformity in the etch rates. Also, it is shown in graph 510 that when the filter 218 is not used, there is a non-uniformity in etch rates.

Figure 12:
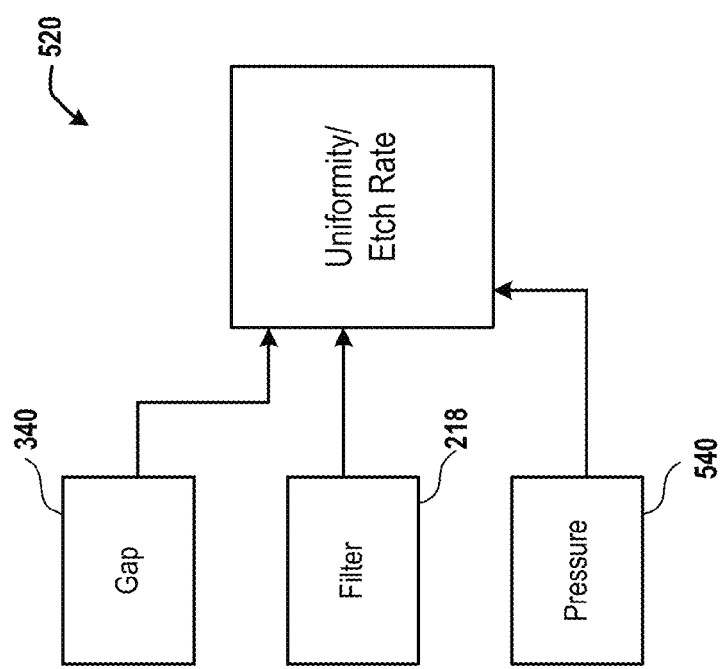
FIG. 12 is a diagram of an embodiment of a system used to illustrate that one or more of a gap between upper and lower electrodes, a filter coupled to an RF supply path, and/or a pressure within a plasma chamber is changed to change uniformity in etch rates or uniformity in deposition rates, in accordance with one embodiment described in the present disclosure.

FIG. 12 is a diagram of an embodiment of a system 520 used to illustrate that one or more of the gap 340 (FIG. 5), the filter 218, and a pressure 540 within the plasma chamber 320

(FIG. 5) is changed to achieve an etch rate and/or a deposition rate and/or a uniformity in etch rates and/or a uniformity in deposition rates.

In some embodiments, a non-uniformity in etch rates or in deposition rates is controlled by controlling the gap 340 in addition to using the filter 218. For example, a processor, e.g., the processor 412 (FIG. 6A), etc., is connected via a motor driver to a motor that is connected to the upper electrode 322 (FIG. 5) and/or to the lower electrode of the chuck 334 (FIG. 5). The processor sends a signal to the motor driver to rotate a rotor of the motor. The rotation of the rotor results in a change in distance between the upper and lower electrodes to control the gap, which includes a distance between the upper and lower electrodes. The change in gap is used to reduce the non-uniformity. In several embodiments, a gap between the upper and lower electrodes includes a space volume between the upper and lower electrodes. In various embodiments, the processor controls the motor via the motor driver to control the gap simultaneously with controlling a capacitance and/or inductance of the filter 218 (FIGS. 4A, 4B) by sending a signal to the motor driver 408 (FIG. 6A) to reduce the non-uniformity.

In various embodiments, a non-uniformity in etch rates or deposition rates is reduced by controlling an amount of pressure within the plasma chamber 320 (FIG. 5) and by using the filter 218. For example, the processor, e.g., the processor 412 (FIG. 6A), etc., is connected to a motor that is connected to a valve. The valve is connected via a tubing to a gas supply, which stores one or more gases. The processor sends a signal to a motor driver to operate a rotor of the motor to open or close the valve. The valve is opened and closed to control, e.g., increase, or decrease, etc., an amount of flow of the one or more gases into the gap 340 within the plasma chamber 320 between upper and lower electrodes. An increase in the amount of flow increases pressure in the chamber and a decrease in the amount of flow decreases the pressure. The pressure is used to reduce the non-uniformity in addition to using the filter 218 (FIGS. 4A, 4B). In some embodiments, the processor controls the pressure in the gap simultaneously with controlling the filter 218 to reduce the non-uniformity.

Figure 13:
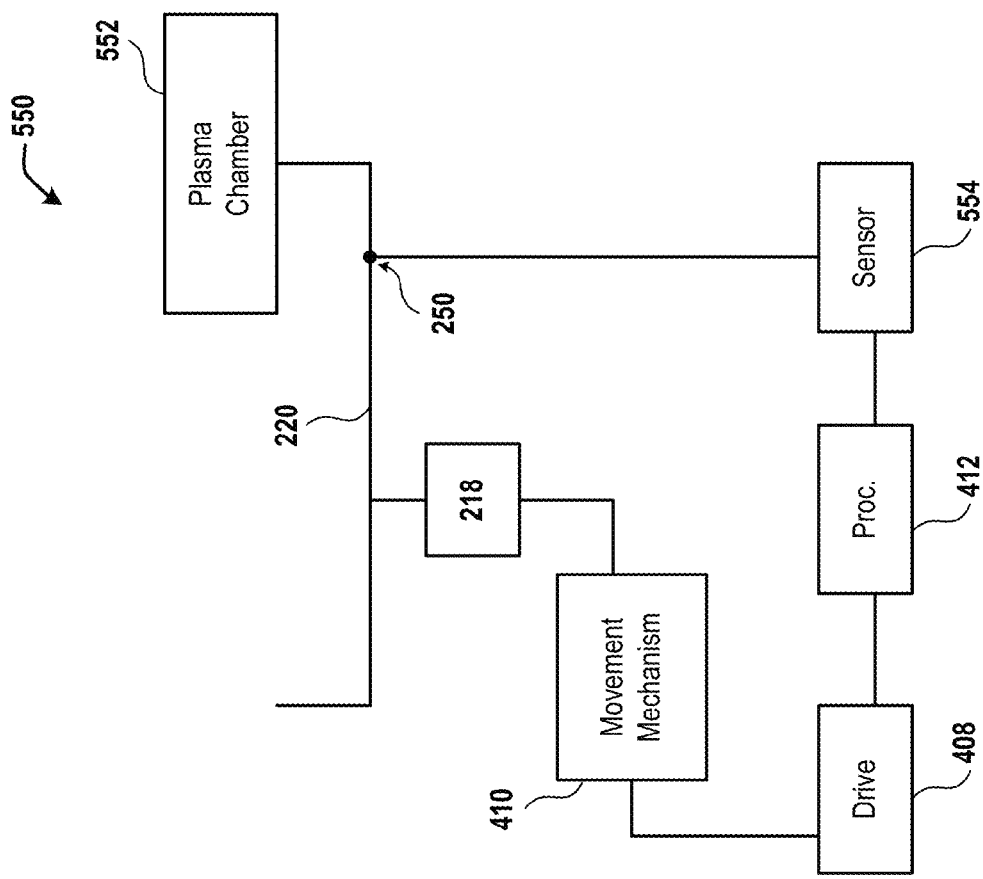
FIG. 13 is a diagram of a feedback system for controlling uniformity in etch rates, or uniformity in deposition rates, or achieving an etch rate, or achieving a deposition rate, in accordance with one embodiment described in the present disclosure.

FIG. 13 is a diagram of an embodiment of a system 550 for using a feedback loop for controlling uniformity in etch rates, or uniformity in deposition rates, or achieving an etch rate, or achieving a deposition rate. The system 550 includes a plasma chamber 552, which is an example of the plasma chamber 215 (FIGS. 4A, 4B). The plasma chamber 552 is connected to the RF supply path 220. For example, a lower electrode of the plasma chamber 552 is connected to the RF supply path 220.

A sensor 554, e.g., a voltage and current probe, a voltage probe, etc., is coupled to the RF supply path 220. For example, the sensor 554 is connected to the RF rod 216A (FIG. 4A). The sensor 554 measures a parameter, e.g., voltage or a complex voltage and current, etc., of the RF supply signal 250 that is output from the filter 218.

The sensor 554 provides the measured parameter to the processor 412. The processor 412 determines whether the measured parameter is similar to, e.g., is equal to or is within a pre-determined range of, etc., a tuning parameter within the tune recipe 256 (FIG. 6A). The tuning parameter corresponds to a uniformity in etch rates or uniformity in deposition rates or a deposition rate or an etch rate. Upon determining that the measured parameter is not similar to the tuning parameter, the processor 412 sends a signal to the driver 408 that generates a current signal to send to the movement mechanism 410. Upon receiving the current signal from the driver 408, the movement mechanism 410 rotates or translates to change a distance between plates of the variable capacitor and/or a length of the variable inductor of the filter 218. The distance between the plates and/or the length is changed to achieve the tuning parameter that was used to determine whether the measured parameter is similar to the tuning parameter. On the other hand, upon determining that the measured parameter is not similar to the tuning parameter, the processor 412 does not send a signal that is used to change the distance between the plates or the length of the inductor.

It is noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator, the y MHz RF generator, and/or the z MHz RF generator are coupled to an inductor within the ICP plasma chamber.

It is also noted that although some of the operations above are described as being performed by the processor 412 (FIG. 6A), in some embodiments, the operations are be performed by one or more digital signal processors of one or more of the x, y, and z MHz RF generators.

It should be noted that in some of the above-described embodiments, an RF supply signal is provided to the lower electrode of the chuck and an upper electrode is grounded. In various embodiments, an RF supply signal is provided to the upper electrode and the lower electrode of a chuck is grounded.

In some embodiments, the operations described herein are practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. In some embodiments, the apparatus is specially constructed for a special purpose computer. When defined as a special purpose computer, the computer can also perform other processing, program execution or routines that are not part of the special purpose, while still being capable of operating for the special purpose. In various embodiments, the operations are processed by a general purpose computer selectively activated or configured by one or more computer programs stored in the computer memory, cache, or obtained over a network. When data is obtained over a network, the data is processed by other computers on the network, e.g., a cloud of computing resources.

One or more embodiments can also be fabricated as computer-readable code on a non-transitory computer-readable medium. The non-transitory computer-readable medium is any memory device that can store data, which can be thereafter be read by a computer system. Examples of the non-transitory computer-readable medium include hard drives, network attached storage (NAS), ROM, RAM, compact disc- ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although some method operations above were described in a specific order in some of the embodiments, it should be understood that in various embodiments, other housekeeping operations are performed in between operations, or operations are adjusted so that they occur at slightly different times, or distributed in a system which allows the occurrence of the processing operations at various intervals associated with the processing, as long as the processing of the overlay operations are performed in the desired way.

In some embodiments, one or more features from any embodiment are combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma system comprising:
a radio frequency (RF) generator;
a matchbox including an impedance matching circuit, the impedance matching circuit coupled to the RF generator via an RF cable;
a plasma reactor coupled to the matchbox via a portion of an RF supply path, the plasma reactor including a chuck, the RF supply path extending from the RF generator through the matchbox, and to the chuck;
a phase adjusting circuit coupled to the portion of the RF supply path between the impedance matching circuit and the chuck, the phase adjusting circuit having a first end coupled to a connection point on the portion of the RF supply path and a second end that is connected to ground; and
a controller coupled to the phase adjusting circuit, the controller for changing a parameter of the phase adjusting circuit to control an impedance of the RF supply path based on a tune recipe.

2. The plasma system of claim 1, wherein the impedance matching circuit matches an impedance of the RF generator and an RF cable system with an impedance of the plasma reactor and an RF transmission line, the portion of the RF supply path including an RF rod of the RF transmission line, the RF transmission line coupling the impedance matching circuit to the plasma reactor, the RF transmission line including the RF a grounded RF tunnel surrounding the RF rod, the RF cable system including cable and an RF cable sheath.

3. The plasma system of claim 1, wherein the plasma reactor includes a lower electrode and an upper electrode, the upper electrode faces the lower electrode, the impedance matching circuit configured to provide an RF signal to the phase adjusting circuit, the phase adjusting circuit configured to modify an impedance of the RF signal to generate another RF signal to provide to the plasma reactor via the portion of the RF supply path and when the lower electrode receives the other RF signal from the phase adjusting circuit, the plasma reactor configured to form plasma within the plasma reactor.

4. The plasma system of claim 1, wherein the portion of the RF supply path includes an RF rod, wherein the RF rod is surrounded by a grounded RF tunnel.

5. The plasma system of claim 1, wherein the phase adjusting circuit includes a variable capacitor, or a variable inductor, or a combination thereof.

6. The plasma system of claim 1, wherein the phase adjusting circuit is coupled to the RF supply path via a connection, wherein the connection point is located between an RF strap and an output of the impedance matching circuit.

7. The plasma system of claim 1, wherein the phase adjusting circuit is coupled to the RF supply path via a connection, wherein the connection point is located between a first RF strap and a second RF strap, wherein the first RF strap is coupled to an output of the impedance matching circuit, wherein the second RF strap is coupled to an RF rod, wherein the portion of the RF supply path includes the RF rod.

8. The plasma system of claim 1, wherein the portion of the RF supply path includes an RF rod, wherein the phase adjusting circuit is coupled to the RF supply path via a connection, wherein the connection point is located between the RF rod and an RF strap, the RF strap coupled via another RF strap to an output of the impedance matching circuit.

9. The plasma system of claim 1, wherein the portion of the RF supply path includes an RF rod, wherein the plasma reactor includes an RF cylinder that is connected to the chuck, wherein the phase adjusting circuit is coupled to the RF supply path via a connection, wherein the connection point is located on the RF cylinder, the RF cylinder coupled to the RF rod via an RF coupling.

10. The plasma system of claim 1, wherein the matchbox has a housing, the phase adjusting circuit is located outside the housing and is coupled to the portion of the RF supply path.

11. The plasma system of claim 1, wherein the portion of the RF supply path includes an RF rod, wherein the matchbox has a housing, the phase adjusting circuit is located within the housing and is coupled to an RF strap located within the housing, the RF strap coupling the impedance matching circuit to the RF rod.

12. The plasma system of claim 1, wherein the portion of the RF supply path includes an RF rod, wherein the RF supply path includes one or more RF straps coupled to the impedance matching circuit, wherein the plasma reactor includes an RF cylinder, wherein the RF rod is coupled to the RF cylinder via an RF coupling, wherein the RF supply path further includes the RF coupling and the RF cylinder, wherein the RF cylinder is coupled to the chuck.

13. The plasma system of claim 1, wherein the impedance is dependent on a capacitance, or an inductance, or a combination thereof of the phase adjusting circuit.

14. The plasma system of claim 1, wherein the impedance is controlled to achieve an etch rate, or a deposition rate, or a uniformity in etch rates, or a uniformity in deposition rates, wherein the etch rate, or the deposition rate, or the uniformity in etch rates, or the uniformity in deposition rates are specified within the tune recipe.

15. The plasma system of claim 1, wherein the controller is configured to control the phase adjusting circuit based on a value of a parameter measured on the RF supply path.

16. The plasma system of claim 1, wherein the phase adjusting circuit includes a filter for filtering an RF supply signal received from the impedance matching circuit and sending the filtered signal to the chuck.

17. The plasma system of claim 16, wherein the filter includes a variable capacitor that is coupled in series with a variable inductor or fixed inductor, wherein the variable inductor or fixed inductor is coupled to ground, wherein the variable capacitor is coupled to the portion of the RF supply path.

18. A system comprising a filter, the filter located between an impedance matching circuit and an electrode of a plasma chamber, wherein the filter is connected at one end to a connection point on an RF supply path between the impedance matching circuit and the electrode, wherein another end of the filter is coupled to ground, wherein the filter is used to control an impedance of a radio frequency (RF) signal to be delivered to the plasma chamber, wherein the RF signal is output from the impedance matching circuit towards the plasma chamber via the RF supply path.

19. The system of claim 18, wherein the filter includes a capacitor, an inductor, or a combination thereof.

20. The system of claim 18, wherein the impedance matching circuit is configured to match an impedance of an RF generator and an RF cable system with an impedance of a plasma reactor and an RF transmission line, wherein the RF transmission line couples the impedance matching circuit to the plasma reactor, wherein the impedance matching circuit is located within a matchbox, wherein the matchbox is coupled to the RF generator via the RF cable system, wherein the plasma reactor includes the plasma chamber.

21. The system of claim 18, wherein the plasma chamber includes a lower electrode and an upper electrode, the upper electrode faces the lower electrode.

22. The system of claim 18, wherein the impedance is dependent on a capacitance, or an inductance, or a combination thereof of the filter.

23. A method comprising:
receiving a radio frequency (RF) signal from an impedance matching circuit, the impedance matching circuit coupled to an RF generator of a plasma tool;
modifying an impedance of the RF signal to achieve a measurable factor, wherein said modifying is performed using a filter that is coupled at one end to a connection point on an RF supply path between the impedance matching circuit and an electrode of a plasma reactor, wherein another end of the filter is connected to ground; and
sending the modified RF signal via the RF supply path to the plasma reactor, the plasma reactor coupled to the impedance matching circuit.

24. The method of claim 23, wherein the RF signal received from the impedance matching circuit is generated when the impedance matching circuit matches an impedance of the RF generator and an RF cable system coupled to the RF generator with an impedance of the plasma reactor and an RF transmission line, the RF transmission line coupling the plasma reactor to the impedance matching circuit.

25. The method of claim 23, wherein the measurable factor includes an etch rate of etching a wafer when present within a plasma chamber of the plasma reactor, a deposition rate of depositing materials on the wafer when present within the plasma chamber, or uniformity in etch rates of etching one or more wafers when present within the plasma chamber, or uniformity in deposition rates of depositing materials on one or more wafers when present within the plasma chamber, or a combination thereof.

26. The method of claim 23, wherein modifying the impedance comprises modifying a capacitance, an inductance, or a combination thereof of a filter, the filter coupled to the impedance matching circuit.

27. The system of claim 18, wherein the RF supply path includes one or more RF straps connected to the impedance matching circuit, or an RF rod connected to the one or more RF straps, or an RF coupling coupled to the RF rod, or an RF cylinder coupled to the RF rod.

28. The method of claim 23, wherein the RF supply path includes one or more RF straps connected to the impedance matching circuit, or an RF rod connected to the one or more RF straps, or an RF coupling coupled to the RF rod, or an RF cylinder coupled to the RF rod.

* * * * *